(12) United States Patent
Chen

(10) Patent No.: US 8,993,429 B2
(45) Date of Patent: Mar. 31, 2015

(54) INTERLAYER CONDUCTOR STRUCTURE AND METHOD

(71) Applicant: Macronix International Co., Ltd., Hsinchu (TW)

(72) Inventor: Shih-Hung Chen, Jhudong Township, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 20 days.

(21) Appl. No.: 14/045,573

(22) Filed: Oct. 3, 2013

(65) Prior Publication Data

US 2014/0264934 A1    Sep. 18, 2014

Related U.S. Application Data

(60) Provisional application No. 61/776,861, filed on Mar. 12, 2013.

(51) Int. Cl.
*H01L 21/44* (2006.01)
*H01L 21/768* (2006.01)
*H01L 27/115* (2006.01)

(52) U.S. Cl.
CPC .... *H01L 21/76897* (2013.01); *H01L 27/11551* (2013.01); *H01L 21/768* (2013.01); *H01L 27/11575* (2013.01); *H01L 27/11582* (2013.01)
USPC ............ 438/599; 257/211; 257/775; 257/776

(58) Field of Classification Search
CPC .................. H01L 21/768; H01L 27/11551
USPC ............................ 438/599; 257/211, 775, 776
See application file for complete search history.

(56) References Cited

U.S. PATENT DOCUMENTS

| 6,034,882 | A | 3/2000 | Johnson et al. |
| 6,218,695 | B1 * | 4/2001 | Nachumovsky ............. 257/296 |
| 6,323,117 | B1 | 11/2001 | Noguchi |

(Continued)

FOREIGN PATENT DOCUMENTS

| EP | 1936681 A1 | 6/2008 |
| EP | 2048709 A2 | 4/2009 |

(Continued)

OTHER PUBLICATIONS

U.S. Appl. No. 13/907,607, "Conductor Structure and Method", filed on May 31, 2013.

(Continued)

*Primary Examiner* — Nicholas Tobergte
(74) *Attorney, Agent, or Firm* — James F. Hann; Haynes Beffel & Wolfeld LLP

(57) ABSTRACT

To form an interconnect conductor structure, a stack of pads, coupled to respective active layers of a circuit, is formed. Rows of interlayer conductors are formed to extend in an X direction in contact with landing areas on corresponding pads in the stack. Adjacent rows are separated from one another in a Y direction generally perpendicular to the X direction. The interlayer conductors in a row have a first pitch in the X direction. The interlayer conductors in adjacent rows are offset in the X direction by an amount less than the first pitch. Interconnect conductors are formed over and in contact with interlayer conductors. The interconnect conductors extend in the Y direction and have a second pitch less than the first pitch.

18 Claims, 26 Drawing Sheets

(56) References Cited

U.S. PATENT DOCUMENTS

| | | | |
|---|---|---|---|
| 6,906,361 B2 | 6/2005 | Zhang | |
| 6,906,940 B1 | 6/2005 | Lue | |
| 7,018,783 B2 | 3/2006 | Iwasaki et al. | |
| 7,081,377 B2 | 7/2006 | Cleeves | |
| 7,129,538 B2 | 10/2006 | Lee et al. | |
| 7,177,169 B2 | 2/2007 | Scheuerlein | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,696,559 B2 | 4/2010 | Arai et al. | |
| 7,851,849 B2 | 12/2010 | Kiyotoshi | |
| 8,363,476 B2 | 1/2013 | Lue et al. | |
| 8,383,512 B2 | 2/2013 | Chen et al. | |
| 8,394,716 B2 * | 3/2013 | Hwang et al. | 438/667 |
| 8,467,219 B2 | 6/2013 | Lue | |
| 8,503,213 B2 | 8/2013 | Chen et al. | |
| 8,659,946 B2 * | 2/2014 | Jin et al. | 365/185.17 |
| 8,736,069 B2 | 5/2014 | Chiu et al. | |
| 8,759,899 B1 | 6/2014 | Lue et al. | |
| 2004/0023499 A1 | 2/2004 | Hellig et al. | |
| 2004/0056367 A1 * | 3/2004 | Jassowski | 257/782 |
| 2004/0145024 A1 * | 7/2004 | Chen et al. | 257/390 |
| 2004/0188822 A1 | 9/2004 | Hara | |
| 2005/0122780 A1 * | 6/2005 | Chen et al. | 365/185.17 |
| 2005/0280061 A1 | 12/2005 | Lee | |
| 2007/0045708 A1 | 3/2007 | Lung | |
| 2007/0090434 A1 | 4/2007 | Davies et al. | |
| 2007/0123015 A1 * | 5/2007 | Chinthakindi et al. | 438/597 |
| 2007/0140001 A1 | 6/2007 | Motoi et al. | |
| 2007/0158736 A1 * | 7/2007 | Arai et al. | 257/315 |
| 2007/0231750 A1 | 10/2007 | Parikh | |
| 2007/0252201 A1 | 11/2007 | Kito et al. | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0175032 A1 | 7/2008 | Tanaka et al. | |
| 2008/0180994 A1 | 7/2008 | Katsumata et al. | |
| 2008/0246167 A1 * | 10/2008 | Lin et al. | 257/786 |
| 2008/0247230 A1 | 10/2008 | Lee et al. | |
| 2008/0285350 A1 | 11/2008 | Yeh | |
| 2009/0001530 A1 | 1/2009 | Goto | |
| 2009/0032966 A1 | 2/2009 | Lee et al. | |
| 2009/0097321 A1 | 4/2009 | Kim et al. | |
| 2009/0184360 A1 | 7/2009 | Jin et al. | |
| 2010/0007001 A1 | 1/2010 | Wang et al. | |
| 2010/0054015 A1 | 3/2010 | Lee et al. | |
| 2010/0109164 A1 | 5/2010 | Kang et al. | |
| 2010/0133645 A1 | 6/2010 | Dunne | |
| 2010/0182041 A1 | 7/2010 | Feng et al. | |
| 2010/0225000 A1 | 9/2010 | Sugizaki et al. | |
| 2010/0270593 A1 | 10/2010 | Lung et al. | |
| 2011/0031630 A1 | 2/2011 | Hashimoto | |
| 2011/0057321 A1 | 3/2011 | Wang et al. | |
| 2011/0116309 A1 | 5/2011 | Lung | |
| 2011/0235408 A1 | 9/2011 | Minemura et al. | |
| 2012/0119283 A1 | 5/2012 | Lee et al. | |
| 2012/0182806 A1 | 7/2012 | Chen et al. | |
| 2013/0082341 A1 | 4/2013 | Shimizu et al. | |
| 2013/0334575 A1 * | 12/2013 | Chen et al. | 257/202 |
| 2013/0341797 A1 | 12/2013 | Lim | |

FOREIGN PATENT DOCUMENTS

| | | |
|---|---|---|
| EP | 2192612 A2 | 6/2010 |
| TW | I308374 B | 4/2009 |
| TW | 201123266 A | 7/2011 |

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

Choi et al., "3D approaches for non-volatile memory", 2011 Symposium on VLSI Technology, Digest of Technical Papers, pp. 178-179, Jun. 14-16, 2011.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Extended European Search Report for EP 12170759, dated Feb. 5, 2013, 12 pages.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hu J. et al., "Reducing Write Activities on Non-volatile Memories in Embedded CMPs via Data Migration and Recomputation," Proc. of the IEEE/ACM DAC, pp. 350-355, 2010.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

(56) References Cited

OTHER PUBLICATIONS

Nowak et al., "Intrinsic fluctuations in Vertical NAND flash memories," 2012 Symposium on VLSI Technology, Digest of Technical Papers, pp. 21-22, Jun. 12-14, 2012.
Paul et al., "Impact of a Process Variation on Nanowire and Nanotube Device Performance," IEEE Trans. on Electron Devices, vol. 54, No. 9, Sep. 2007, pp. 2369-2376.
Tanaka et al., "Bit Cost Scalable Technology with Punch and Plug Process for Ultra High Density Flash Memory," VLSI Technology, 2007 IEEE Symposium on Jun. 12-14, 2007, pp. 14-15.
Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

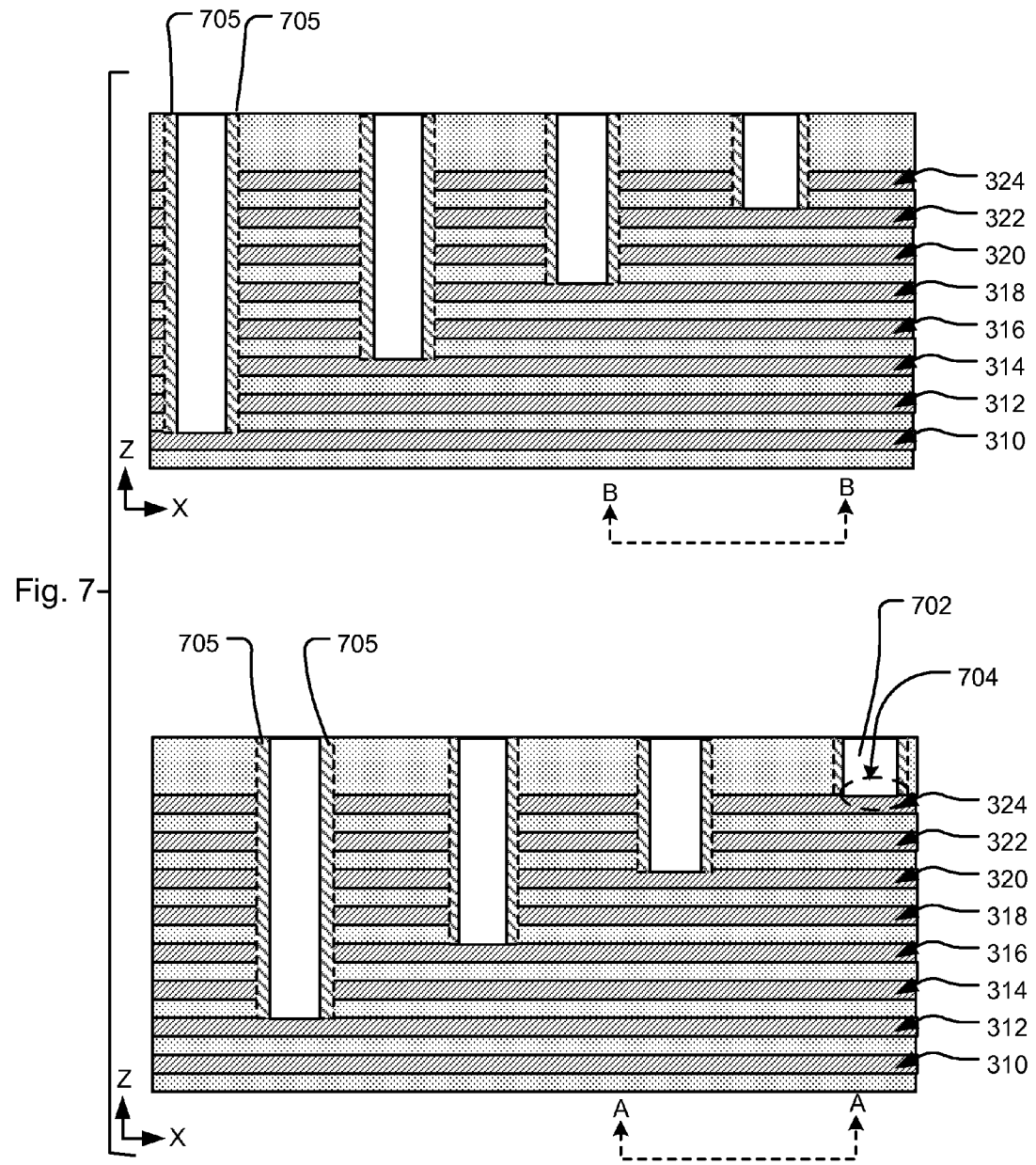

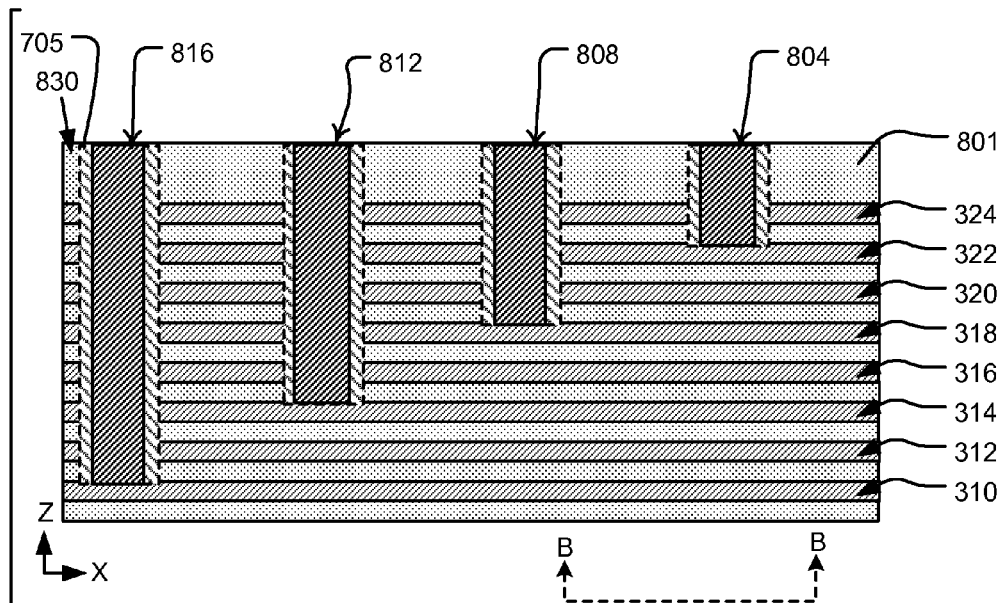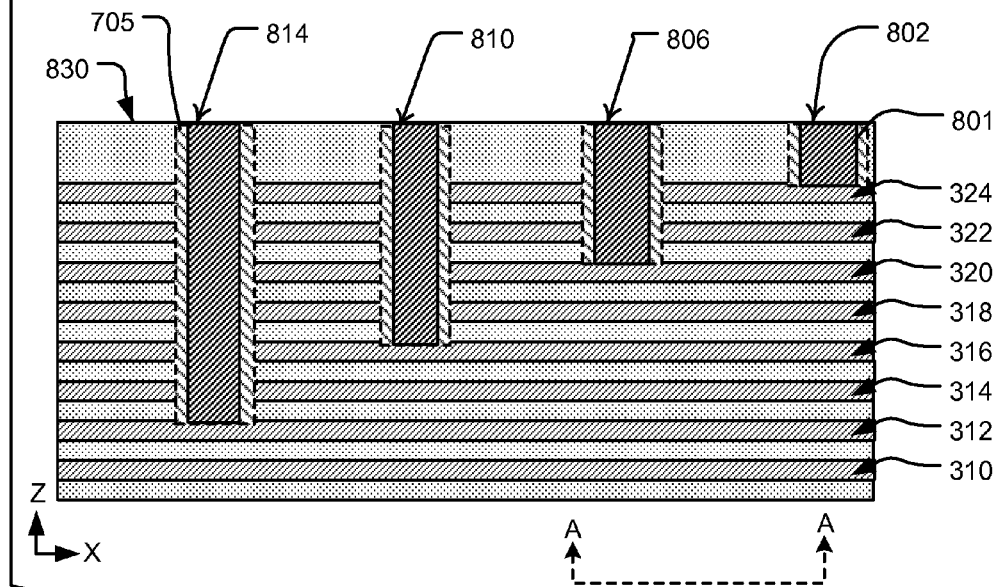
Fig. 8

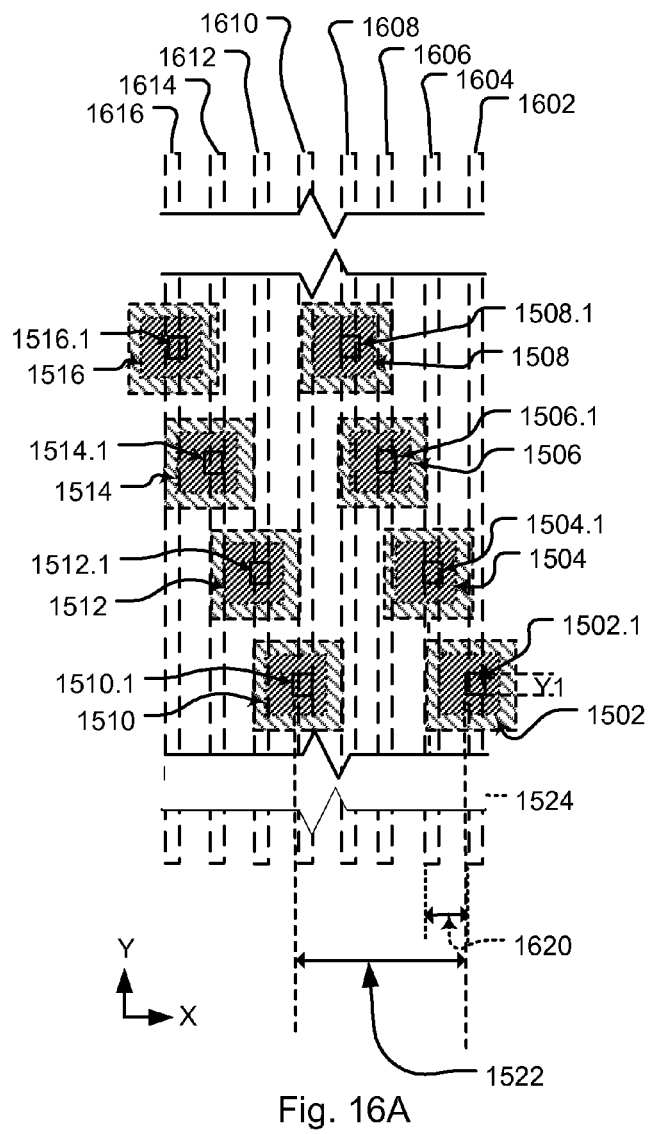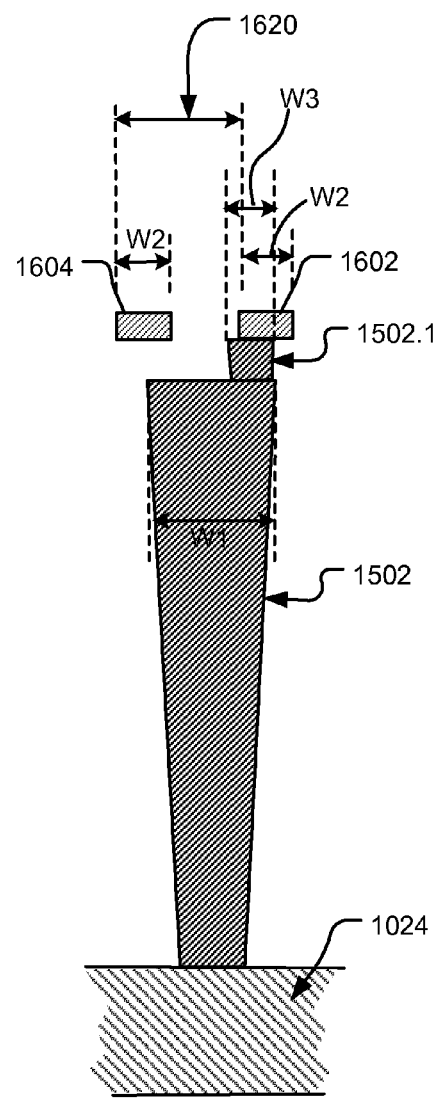
Fig. 16A
Fig. 16B

INTERLAYER CONDUCTOR STRUCTURE AND METHOD

CROSS-REFERENCE TO RELATED APPLICATIONS

This application claims benefit of U.S. Provisional Patent Application No. 61/776,861, filed 12 Mar. 2013.

BACKGROUND

The present invention relates to high density devices. In particular, embodiments of the present invention provide a method for manufacturing and a structure for connecting conductors to multiple planes in a three-dimensional high density semiconductor device, such as memory device.

Three dimensional (3D) semiconductor devices are characterized by multiple layers. In a memory device, each of the layers can include a planar array of memory cells. For certain three-dimensionally stacked memory devices, active layers can comprise active strips of materials configured as bit lines or word lines for memory cells stacked in spaced-apart ridge-like structures. The active layers can be made from a doped (p-type or n-type) or undoped semiconductor material. In such 3D memory, memory cells can be disposed at the cross-points of the stacked bit lines or word lines and the crossing word lines or bit lines, forming a 3D memory array.

Examples of memory devices like this are described in commonly owned U.S. Patent Publication No. 2012/0182806, filed Apr. 1, 2011, entitled *Memory Architecture of 3D Array With Alternating Memory String Orientation and String Select Structures* by inventors Shih-Hung Chen and Hang-Ting Lue and in commonly owned U.S. Pat. No. 8,363,476, filed 19 Jan. 2011, entitled *Memory Device, Manufacturing Method And Operating Method Of The Same*, by inventors Hang-Ting Lue and Shi-Hung Chen, both of which are incorporated by reference as if fully set forth herein. In these examples, the active strips in a set in each layer are coupled to a corresponding pad in a stack of pads. The pads provide landing areas for interlayer conductors, which are connected to overlying conductor lines as bit lines for the memory device. The interlayer conductors extend vertically through the stack of pads in the 3D device, and can require relatively large area in the layout to account for taper and alignment issues that arise in manufacture, particularly as the number of layers increases. The relatively large area required can become a limiting factor in the density of overlying interconnect lines, such as global bit lines.

The density of the interconnect lines can be critical to device performance and cost. For example, NAND memory can include page operations, including page read and program. The size of a page, and therefore data rate, in such devices depends on the global bit line density. To achieve a higher bit line density and therefore a faster memory device, pitch of the bit lines needs to be reduced (where the pitch is the average center to center distance between adjacent features like the bit lines).

It is desirable, therefore, to provide a method and structure for making interconnects, such as high density bit lines, which make contact to a plurality of layers in a 3D device.

SUMMARY

A method of forming an interconnect conductor structure can be carried out as follows. A stack of pads, coupled to respective active layers of a circuit, is formed. Rows of interlayer conductors are formed to extend in an X direction in contact with landing areas on corresponding pads in the stack. Adjacent rows are separated from one another in a Y direction generally perpendicular to the X direction. The interlayer conductors in a row have a first pitch in the X direction. The interlayer conductors in adjacent rows are offset in the X direction by an amount less than the first pitch. Interconnect conductors are formed over and in contact with interlayer conductors. The interconnect conductors extend in the Y direction and have a second pitch less than the first pitch.

A device includes a stack of pads, interlayer conductors, and interconnect conductors. The stack of pads is coupled to respective active layers of a circuit. Interlayer conductors are arranged in rows extending in an X direction in contact with landing areas on corresponding pads in the stack. Adjacent rows are separated from one another in a Y direction generally perpendicular to the X direction. The interlayer conductors in a row have a first pitch in the X direction. The interlayer conductors in adjacent rows are offset in the X direction by an amount less than the first pitch. The interconnect conductors are over and in contact with interlayer conductors. The interconnect conductors extend in the Y direction and have a second pitch less than the first pitch.

In various embodiments, the present method and structure allow for a high density and narrow pitched interconnect conductor structure for a 3D device.

Other aspects and advantages of the technology are described with reference to the drawing in the detailed description and claims which follow.

BRIEF DESCRIPTION OF THE DRAWINGS

FIGS. 3-9 are diagrams illustrating stages of a method of forming interlayer conductors for a 3D semiconductor device.

FIG. 3 is a top view diagram of a stack of semiconductor pads for forming interlayer conductors for a 3D semiconductor device.

FIG. 4 is a top view diagram illustrating a structure in a stage of forming interlayer conductors for a 3D semiconductor device following FIGS. 3 and 3A.

FIG. 5 are corresponding cross section diagrams for the structure in FIG. 5A.

FIG. 6 are cross sectional diagrams in a stage of forming interlayer conductors for a 3D semiconductor device following FIGS. 5 and 5A.

FIG. 7 four corresponding cross section diagrams for the structure in FIG. 7A.

FIG. 8 shows the structure of FIG. 7 after filling the contact openings with a conductive material to form interlayer conductors.

FIG. 9 is a layout view illustrating an interconnect conductor structure including interlayer conductors for a 3D semiconductor device following the step in FIGS. 8A and 8B.

FIGS. 10-16B are diagrams illustrating stages of a variation of the method in FIGS. 3-9 for forming interlayer conductors for a 3D semiconductor device.

FIG. 10 is a cross sectional view of FIG. 10A.

FIG. 11 is an expanded view of a stack of semiconductor pads in a stage of a method for forming interlayer conductors for a 3D semiconductor device.

FIG. 11A is a corresponding top view of the stack of semiconductor pads in FIG. 11.

FIG. 12 is a cross sectional view diagram in a stage of forming interlayer conductors for a 3D semiconductor device following FIGS. 11 and 11A taken generally along line 12-12 of FIG. 11A.

FIG. 13 is corresponding cross section diagram for the structure in FIG. 13A also taken generally along line 12-12 of FIG. 11A.

FIG. 14 is corresponding cross section diagram for the structure in FIG. 14A.

FIG. 15 is shows the structure of FIG. 14 after filling the contact openings with a conductive material to form interlayer conductors.

FIG. 16 is a layout view illustrating interconnect conductors, interlayer conductor extensions, and interlayer conductors for a 3D semiconductor device following the step in FIGS. 15A and 15B.

FIG. 16A is a simplified top plan view and FIG. 16B is a simplified partial cross-sectional view of the structure of FIG. 16 illustrating relative dimensions and locations of various elements of the interconnect conductors, the interlayer conductor extensions and the interlayer conductors for the 3D semiconductor device, with FIG. 16B suggesting tapering of the interlayer conductor.

DETAILED DESCRIPTION

Figure 1:
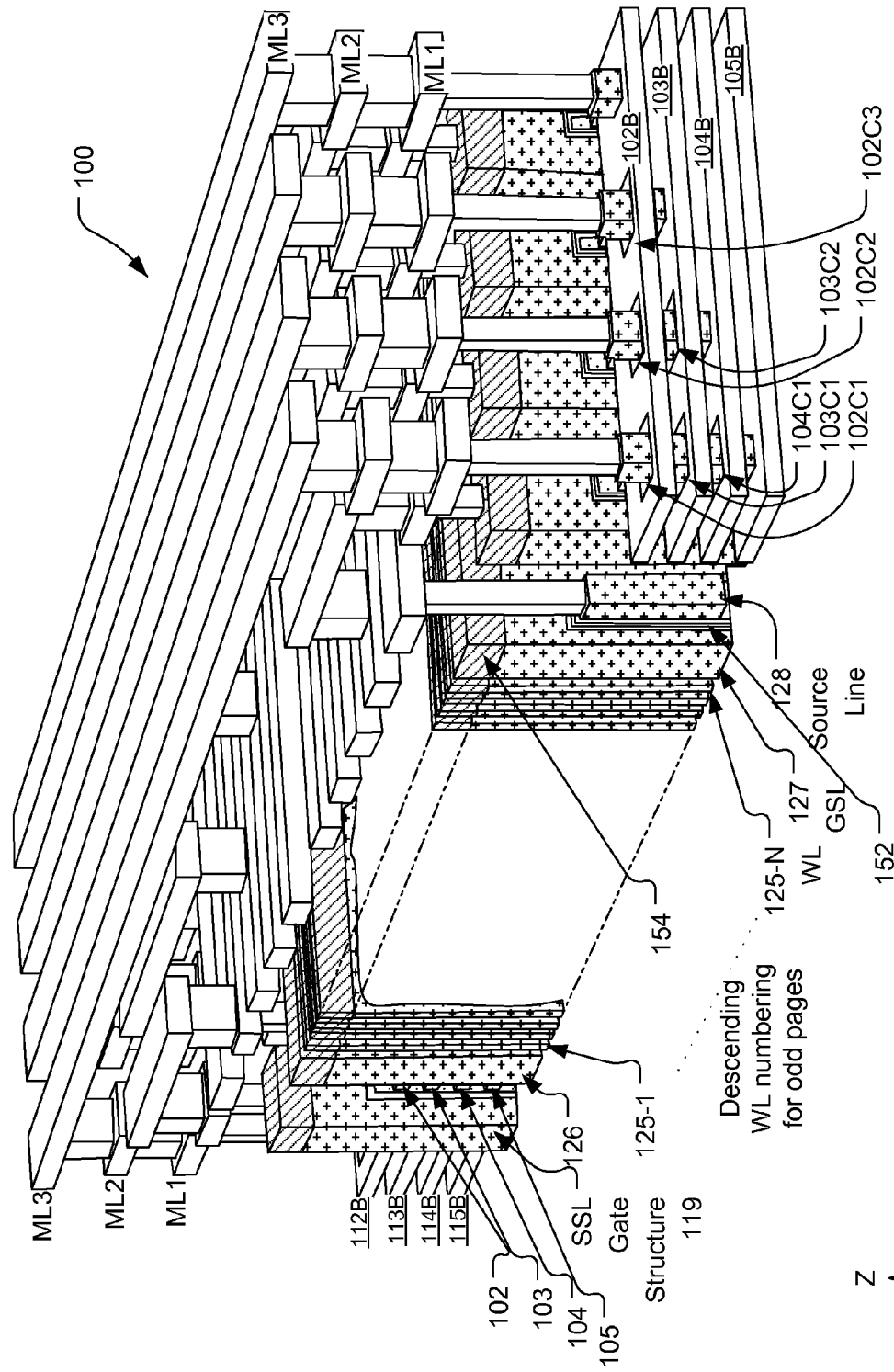
FIG. 1 is a perspective drawing of a semiconductor device including semiconductor pads for interlayer conductors.

A detailed description of various embodiments is described with reference to the Figures. The following description will typically be with reference to specific structural embodiments and methods. It is to be understood that there is no intention to limit the invention to the specifically disclosed embodiments and methods, but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Unless otherwise stated, in this application specified relationships, such as parallel to, aligned with, or in the same plane as, mean that the specified relationships are within limitations of manufacturing processes and within manufacturing variations. When components are described as being coupled, connected, being in contact or contacting one another, they need not be physically directly touching one another unless specifically described as such. Like elements in various embodiments are commonly referred to with like reference numerals.

FIG. 1 is a perspective view of an example of a 3D semiconductor device (for example, a memory device) 100 as described in commonly owned U.S. Publication No. 2012/0182806, referred to above. Various insulating materials are formed but not shown to better illustrate active layers, including semiconductor strips and semiconductor pads for connecting to interlayer conductors, and others. 3D semiconductor device 100 is formed overlying a substrate (not shown) having an insulating layer (not shown) formed thereon. The substrate can include one or more integrated circuits and other structures. Four semiconductor pads 102B, 103B, 104B, and 105B on a proximal end of a stack of active layers and four semiconductor pads 112B, 113B, 114B, and 115B on a distal end of the stack, are shown, but the number of active layers and the corresponding semiconductor pads can be extended to any number of layers N, where N is an integer having a value greater than one. As shown, the 3D semiconductor device 100 includes stacks of active strips (e.g. 102, 103, 104, 105) separated by insulating material. Semiconductor pads (e.g. 102B, 103B, 104B, and 105B) terminate the strips in corresponding active layers. As illustrated, the semiconductor pads 102B, 103B, 104B, and 105B are electrically coupled to the active layers for connection to decoding circuitry to select layers within the array. Semiconductor pads 102B, 103B, 104B, and 105B can be patterned concurrently as the active layers are patterned, with the possible exception of vias for the interlayer conductors. Each of the active strips includes a semiconductor material suitable to act as a channel region in the illustrated embodiment. The strips are ridge-shaped extending on the Y-axis as illustrated, so that the active strips 102, 103, 104, 105 can be configured as bodies including channel regions of flash memory cell strings, for example, in horizontal NAND string configurations. As illustrated, a layer 152 of memory material coats the plurality of stacks of active strips in this example, and at least on the side walls of the active strips in other examples. In other embodiments, the active strips can be configured as word lines for vertical NAND string configurations. See, for example, commonly owned U.S. Pat. No. 8,363,476, referred to above.

Each stack of active strips is terminated at one end by semiconductor pads and the other end by a source line. Therefore, active strips 102, 103, 104, 105 terminate on the proximal end by semiconductor pads 102B, 103B, 104B, and 105B and a source line terminal 119 on the distal end of the strips passing through gate select line 127. Active strips 112, 113, 114, 115 terminate on the distal end by semiconductor pads 112B, 113B, 114B, and 115B and a source line terminal (for example, source line 128) passing through gate select line 126 near the proximal end of the strips.

In the embodiment of FIG. 1, a plurality of conductors 125-1 through 125-N is arranged orthogonally over the plurality of stacks of active strips. The conductors 125-1 through 125-N, have surfaces conformal with the plurality of stacks of active strips, within the trenches defined by the plurality of stacks, and defining a multilayer array of interface regions at cross-points between side surfaces of the active strips 102, 103, 104, 105 on the stacks and conductors 125-1 through 125-N (for example, word lines or source select lines). As shown, a layer of silicide (e.g. tungsten silicide, cobalt silicide, titanium silicide or nickel silicide) 154 can be formed over the top surfaces of conductors (for example, word lines or source select lines).

Depending upon the implementation, layer 152 of memory material can comprise multilayer dielectric charge storage structures. For example, a multilayer dielectric charge storage structure includes a tunneling layer comprising a silicon oxide, a charge trapping layer comprising a silicon nitride, and a blocking layer comprising a silicon oxide. In some examples, the tunneling layer in the dielectric charge storage layer can comprise a first layer of silicon oxide less than about 2 nanometers thick, a layer of silicon nitride less than about 3 nanometers thick and a second layer of silicon oxide less than about 3 nanometers thick. In other implementations, layer 152 of memory material can comprise only a charge trapping layer without the tunneling layer or the blocking layer.

In the alternative, an anti-fuse material such as a silicon dioxide, silicon oxynitride or other silicon oxides, for example, having a thickness on the order of 1 to 5 nanometers, can be utilized. Other anti-fuse materials may be used, such as silicon nitride. For anti-fuse embodiments, active strips 102, 103, 104, 105 can be a semiconductor material with a first conductivity type (e.g. p-type). Conductors (for example, word lines or source select lines) 125-N can be a semiconductor material with a second conductivity type (e.g. n-type). For example, the active strips 102, 103, 104, 105 can be made using p-type polysilicon while the conductors 125-N can be made using relatively heavily doped n+-type polysilicon. For anti-fuse embodiments, the width of the active strips should be enough to provide room for a depletion region to support the diode operation. As a result, memory cells comprising a rectifier formed by the p-n junction with a programmable anti-fuse layer in between the anode and cathode are formed in the 3D array of cross-points between the polysilicon strips and conductor lines.

In other embodiments, different programmable resistance memory materials can be used as the memory material, including metal oxides like tungsten oxide on tungsten or doped metal oxide, and others. Some of such materials can form devices that can be programmed and erased at multiple voltages or currents, and can be implemented for operations for storing multiple bits per cell.

As can be seen in FIG. 1, the semiconductor pads 102B, 103B, 104B, and 105B are coupled on one side to active strips in the corresponding layer of the device, such as by being formed of a continuous patterned layer of semiconductor. In some embodiments, the pad can be coupled on two sides to active strips in the corresponding layer. In other embodiments, the pads can be connected to the active strips using other materials and structures that allow for electrical communication of the voltages and currents needed for operation of the device. Also, an overlying insulator layer (not shown) and semiconductor pads 102B, 103B, 104B, 105B, except the lowermost pad, include openings 102C1, 102C2, 102C3, 103C1, 103C2, 104C1, that expose landing areas on underlying pads forming a stairstep structure in this example.

Figure 2:
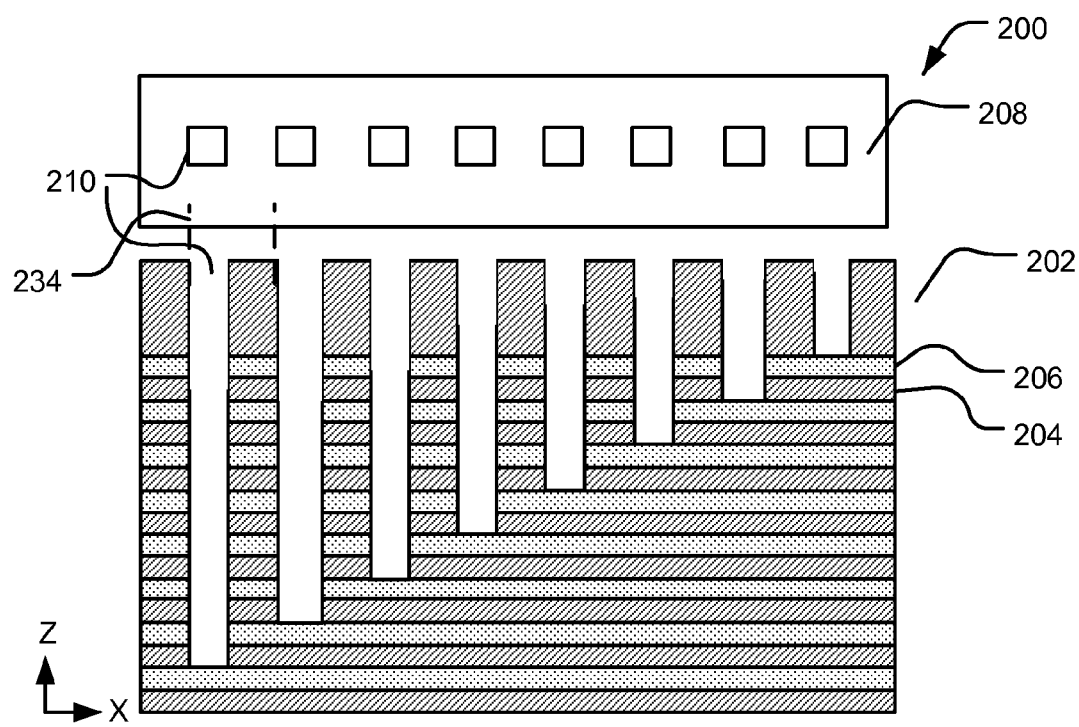
FIG. 2 is a cross section view of a stack of semiconductor pads including via openings for a conductor structure for a 3D semiconductor device.

FIG. 2 illustrates a cross section view 202 of a stack 200 of semiconductor pads 206 (like 102B, 103B, 104B, and 105B in FIG. 1) configured in a stair step manner separated by interlayer insulator 204. Corresponding top view 208 is also illustrated. As shown in cross sectional view 202, eight layers of semiconductors pad 206, each associated with a corresponding active layer is illustrated. A plurality of opening 210 characterized by a pitch 234 to expose a landing area for interlayer conductors, for example, global bit lines is also shown.

Figure 2A:
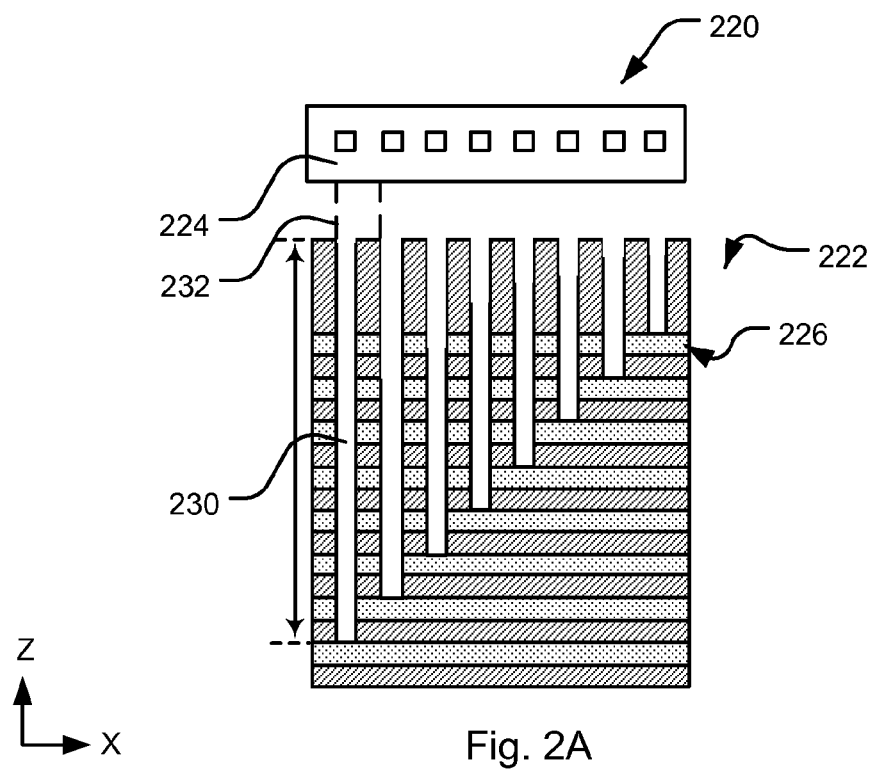
FIG. 2A is a cross sectional view like that of FIG. 2 for a stack of semiconductor pads for a conductor structure for a 3D semiconductor device having a density twice that of the device in FIG. 2.

FIG. 2A illustrates a stack 220 of semiconductor pads 226 for a semiconductor device having a bit line density twice as high as in stack 200 in FIG. 2. A cross section view 222 and a corresponding top view 224 are illustrated. As shown, pitch 232 for openings 230 is tight and the aspect ratio of the openings 230 for interlayer conductors is high, which is challenging in fabrication.

FIGS. 3-9 are diagrams illustrating stages of a method of forming conductive lines (for example, ML3 in FIG. 1) including interlayer conductors connecting active elements to various controlling circuitries (including, for example, a read circuitry or a decoding circuitry) for a high density 3D semiconductor device, for example, a memory device as in FIG. 1.

Figure 3:
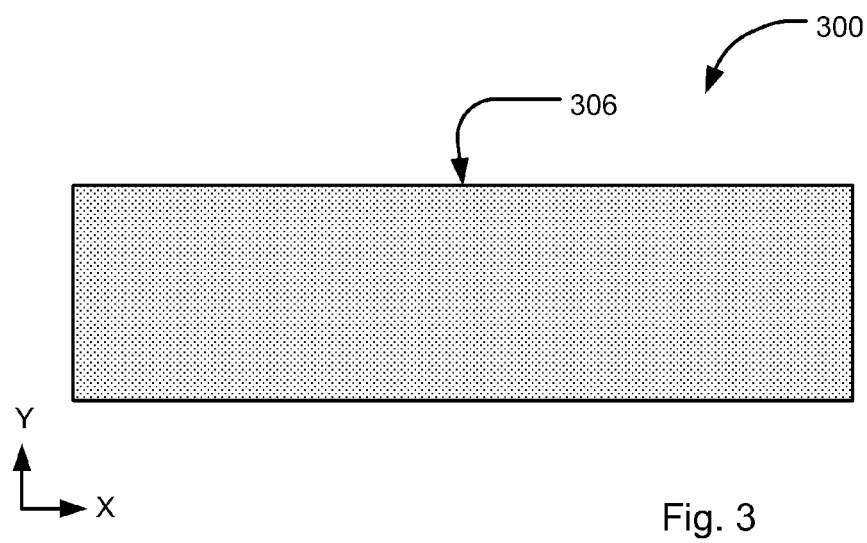
Figure 3A:
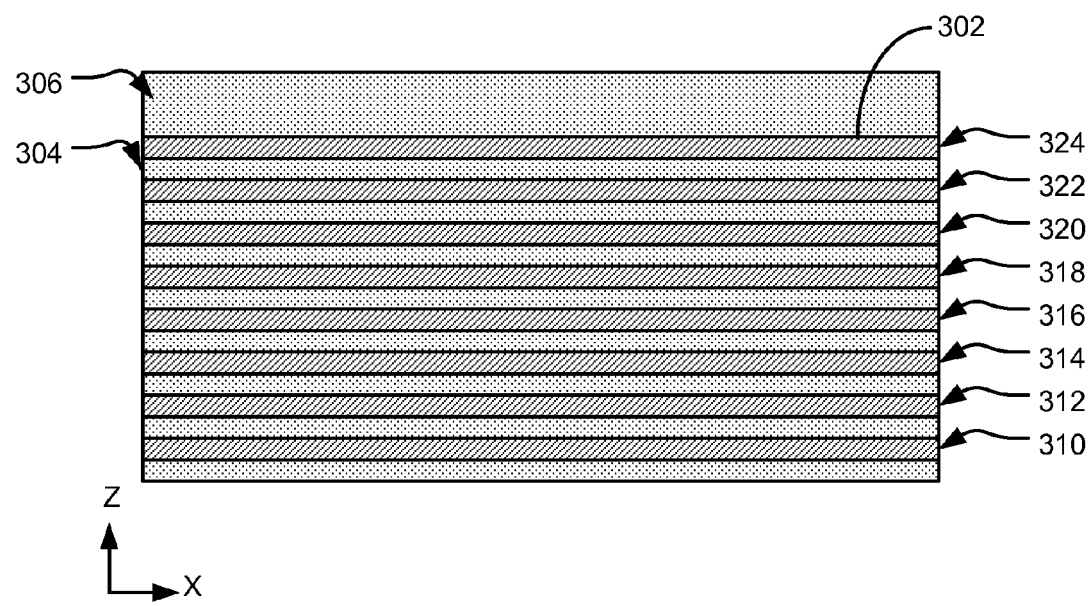
FIG. 3A is a cross sectional view diagram of FIG. 3.

FIG. 3 illustrates a top view 300 of a stack of the semiconductor pads (like pads 102B, 103B, 104B, 105B in FIG. 1) and FIG. 3A illustrates a corresponding cross section view in the XZ plane. Each of the semiconductor pads has an outer perimeter and a first side 302 (longitudinal in this illustration, along X direction) coupled to a corresponding active layer for the memory array. As an example, the stack includes eight semiconductor layers 310, 312, . . . through 324, also referred to as semiconductor pads 310, 312, . . . through 324, separated by insulation layers 304. Many more layers can be included depending on the implementation, such as the number of bit lines. An insulation layer 306 overlies the stack, as shown. The semiconductor layers can be undoped or doped using a suitable impurity (n type or p type).

Figure 4:
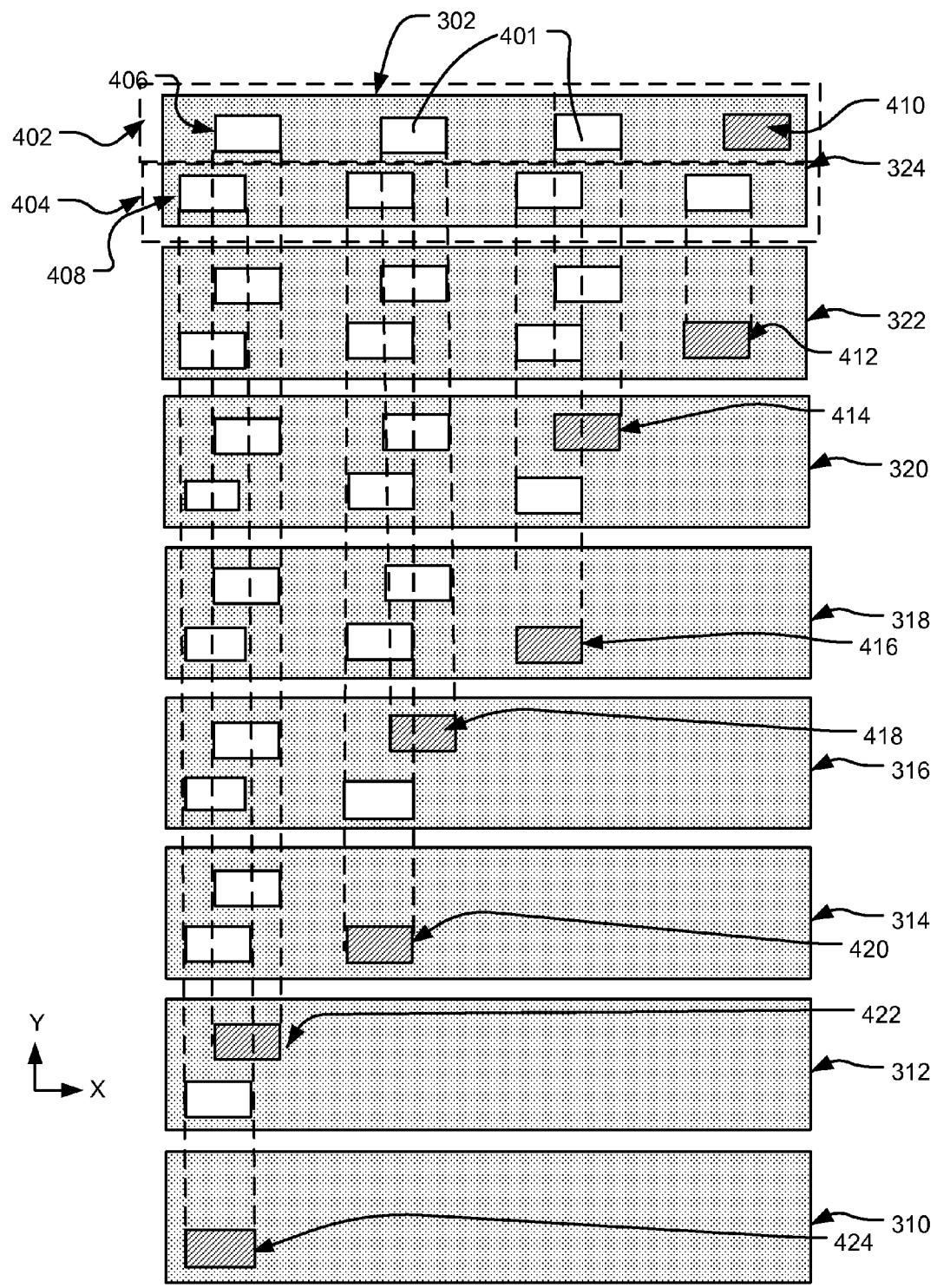

FIG. 4 is a top view diagram illustrating each of the semiconductor pads like that in FIG. 3 after forming openings 401 in the overlying insulation layer 306 and the semiconductor pads except the lowest semiconductor pad 310. As shown, the openings 401 expose a landing area for respective interlayer conductors on each of the semiconductor pads in the stack: landing area 410 on semiconductor pad 324, 412 on semiconductor pad 322, 414 on semiconductor pad 320, 416 on semiconductor pad 318, 418 on semiconductor pad 316, 420 on semiconductor pad 314, 422 on semiconductor pad 312, 424 on semiconductor pad 310. The openings 401 can be formed using the method as detailed in U.S. Pat. No. 8,383,512, entitled Method for Making Multilayer Connection Structure, issued 26 Feb. 2013, the disclosure of which is incorporated by reference.

From the various top views in FIG. 4, the openings 401 are configured in such a way that the landing areas are configured in one of the two rows 402, 404 on the corresponding semiconductor pads. The number of rows can increase to accommodate a narrower pitch interconnect conductors (like ML3 in FIG. 1). For example, on pad 324, openings 401 in rows 402, 404 are aligned parallel to first side 302 of the outside perimeter (along the X direction). To accommodate for the tight pitch of the interconnect conductors, openings 401 in row 402 have a left side 406 that are not aligned to left side 408 of openings 401 in row 404. Openings 401 in row 402 are not aligned to openings in row 404 in a traverse direction (Y-direction) and are offset.

Figure 5:
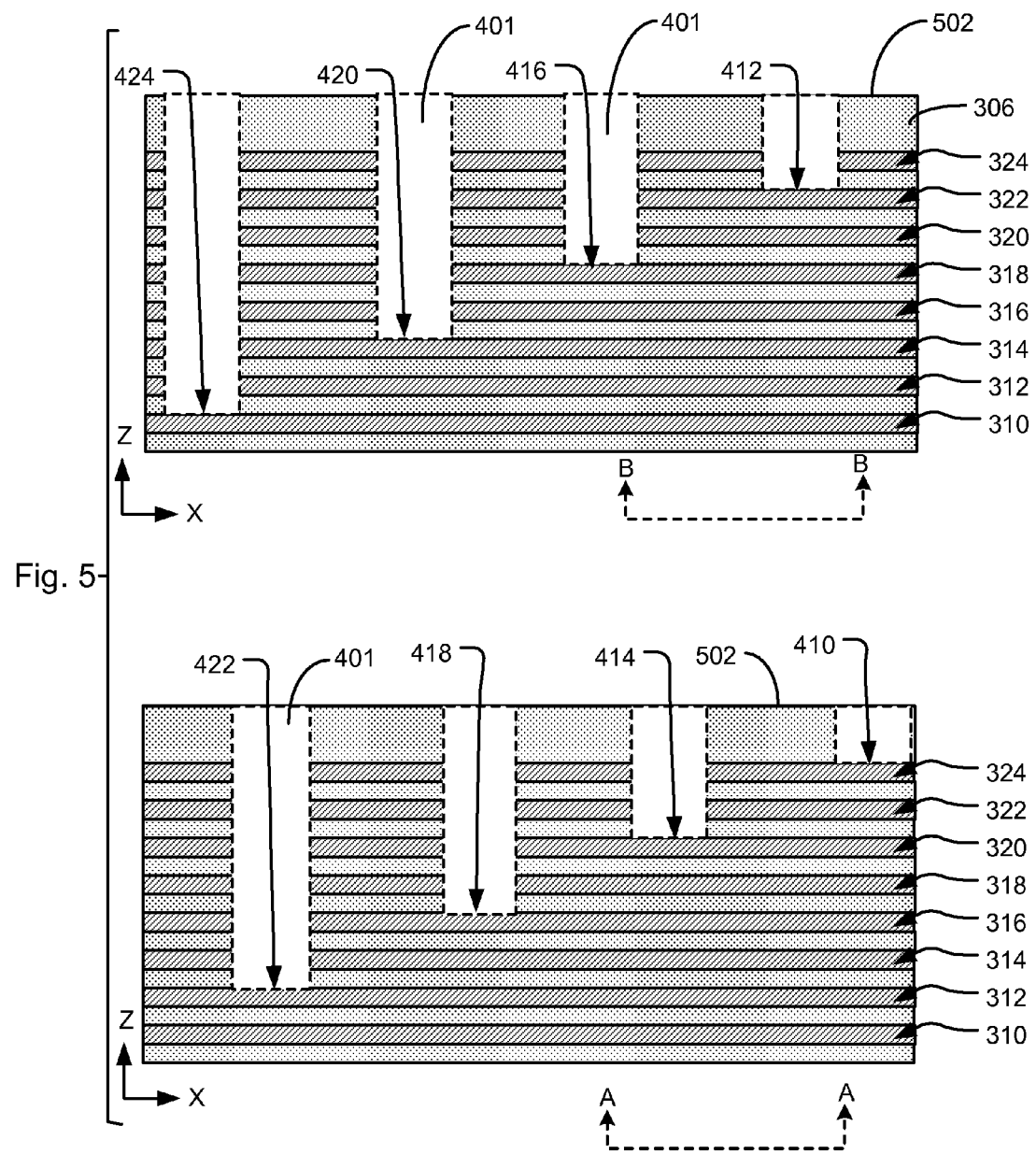
Figure 5A:
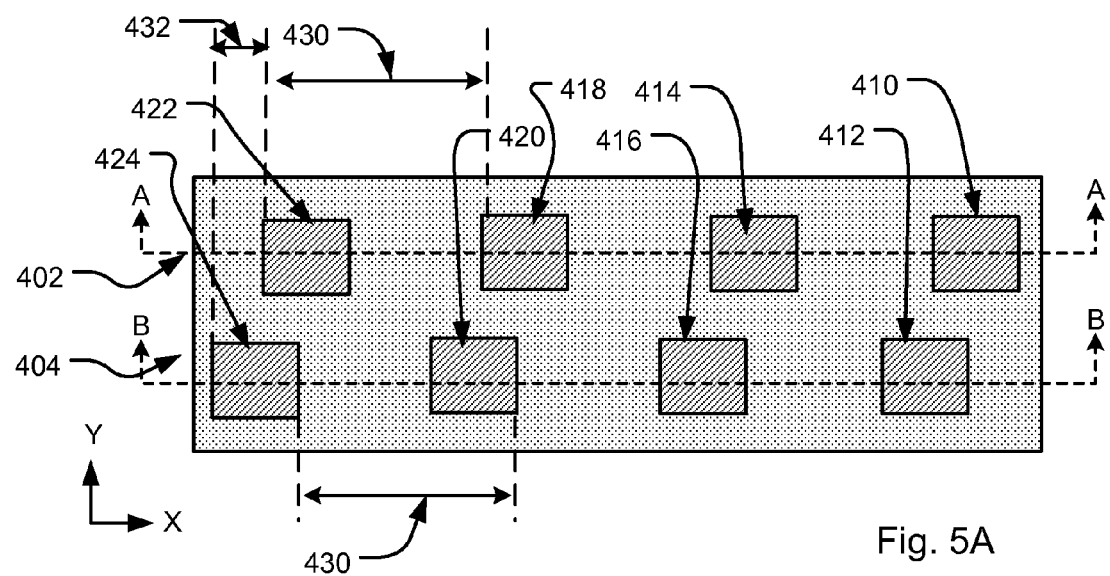
FIG. 5A is a top view diagram illustrating a structure in a stage of forming interlayer conductors for a 3D semiconductor device following FIG. 4.

FIG. 5 illustrates cross sectional views of the stack of semiconductor pads in FIG. 4 taken generally along lines A-A and B-B of the corresponding top view in FIG. 5A. As a result of the arrangement of openings in each of the semiconductor pads, the landing areas are arranged in a "twisted" stair steps manner as shown in the cross sectional views in FIG. 5. From the top view in FIG. 5A, landing areas are aligned in the X direction, parallel to the first side 302 and have an lateral offset by an amount 432 viewed in the Y-direction to accommodate a large density and tight pitch of conductor lines (for example, ML3 in FIG. 1). Additionally, the landing areas are non-intersecting in the vertical or Z-direction as shown in FIG. 4. The landing areas in each row, such as landing areas 410, 414, 418, 422 in row 402 and landing areas 412, 416, 420, 424 in row 404 are at a pitch 430 in the X direction from the top view.

Figure 6:
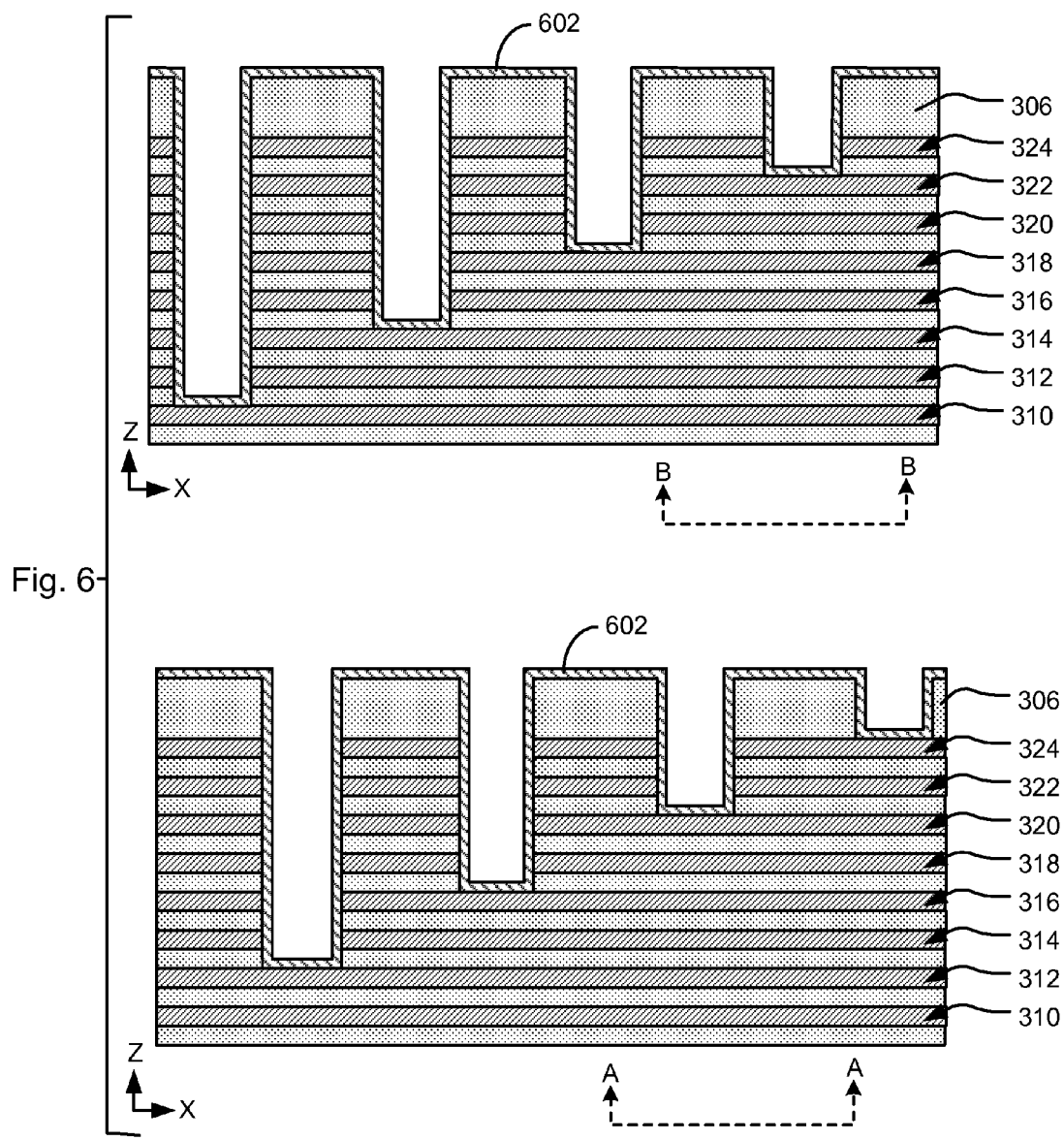

FIG. 6 are cross-section views like those of FIG. 5 after deposition of an insulator layer 602. Insulator layer 602 lines openings 401 and covers upper surface 502 of insulator layer 306.

Figure 7A:
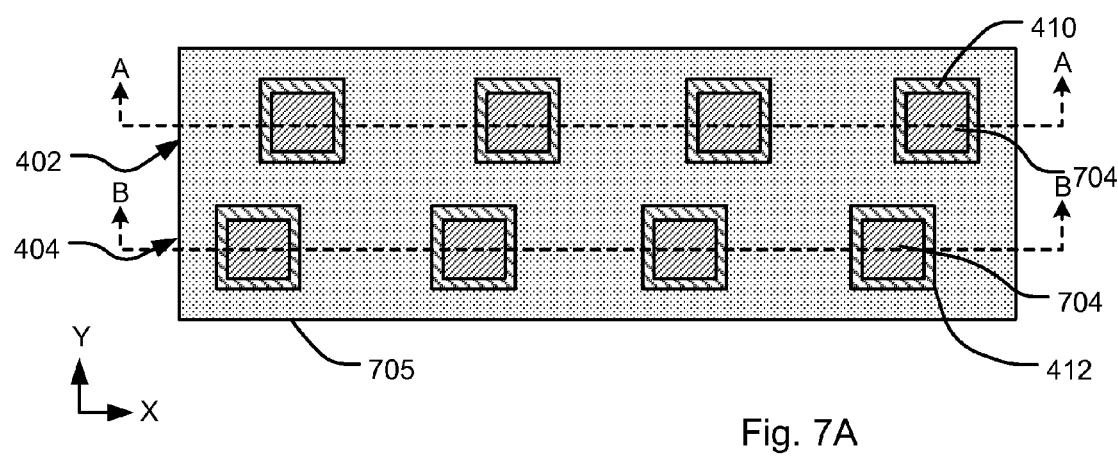
FIG. 7A is a top view diagram illustrating a structure in a stage of forming interlayer conductors for a 3D semiconductor device following FIG. 6.

FIG. 7 are cross sectional views like those of FIG. 6 after etching those portions of insulator layer 602 on upper surface 502 and on landing areas 410-424. This creates a plurality of via openings or contact openings 702 laterally bounded by sidewall insulators 705. FIG. 7A illustrates a corresponding top view. Each via opening 702 exposes a contact area 704 for an interlayer conductor on each of the semiconductor pads. In this example, via openings 702 are centered within the insulation fill 602 within openings 401 so that sidewall insulation 705 is of equal thickness on all sides of contact opening 702. However, in certain implementations, the via openings 702 can be configured to be closer to a left side or a right side in the first row 402 and to the other side of the landing areas in the second row 404 to improve the process window. Additionally, the via openings 702 have a length and a width, measured in the X-Y plane, no greater than the length and the width of the corresponding landing areas 410-424.

FIG. 8 shows the structure in FIG. 7 after a conductor material is deposited to fill each of the via openings 702 to form a plurality of interlayer via conductors 802, 804, . . . 814, 816. The conductor material can be removed from the insulator fill material and insulator material surface 830 to physically isolate the interlayer conductors, as shown. Interlayer conductors 802, 804, . . . 814, 816 can be a polysilicon material (p-doped or n-doped) or a metal material depending on the embodiment.

Figure 8A:
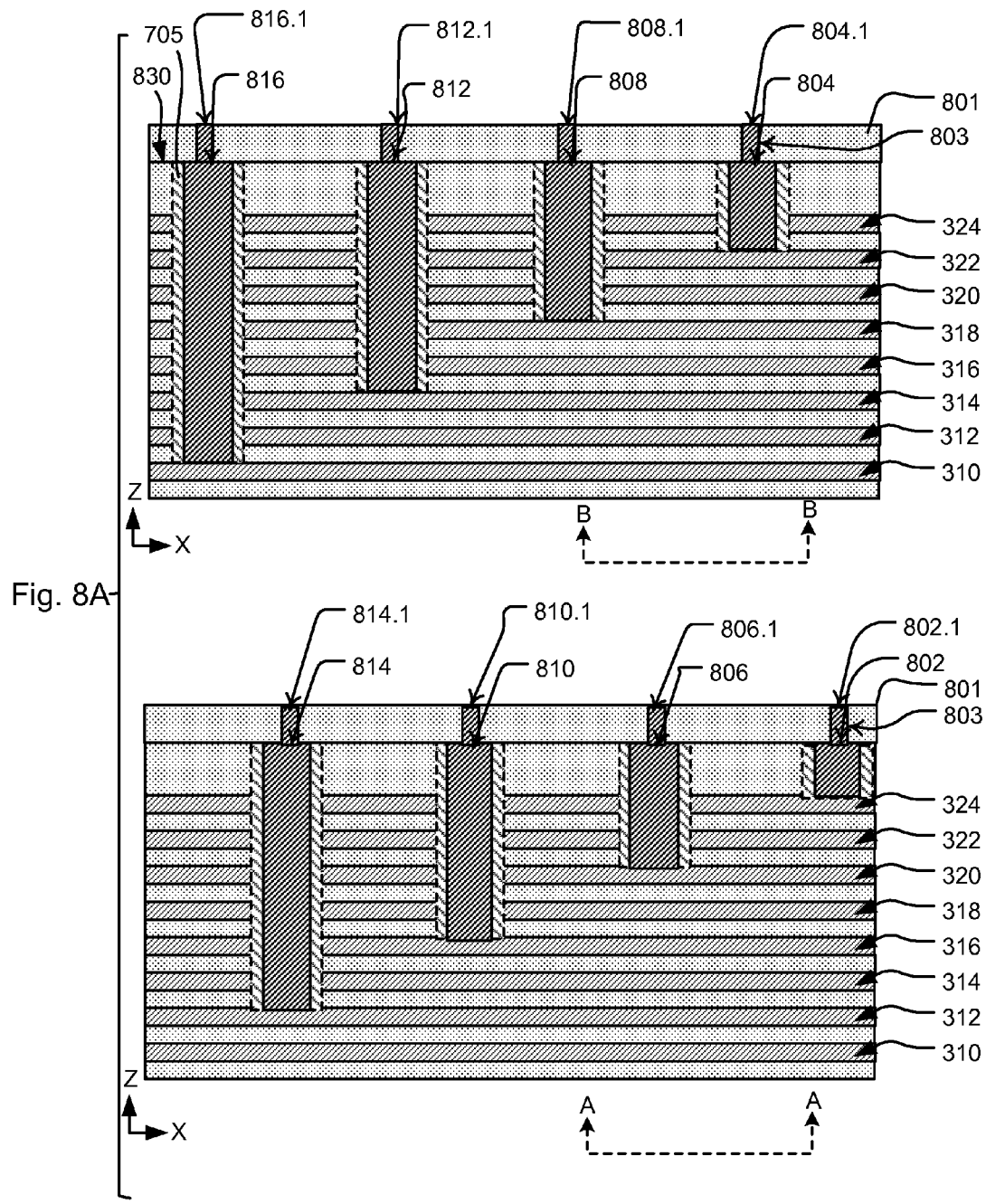
FIG. 8A shows the structure of FIG. 8 after forming an insulation layer over the upper ends of the interlayer conductors, forming relatively narrow openings through the insulation layer extending to the interlayer conductors, and filling the relatively narrow openings with a conductive material creating interlayer conductor extensions.

FIG. 8A shows structure similar to that of FIG. 8 after depositing an insulation layer 801 on surface 830 followed by forming relatively narrow openings 803 through insulation layer 801 to open onto the upper surface of interlayer conductors 802, 804, . . . 814, 816. Openings 803 are relatively narrow compared to the cross-sectional areas of the interlayer conductors. This is followed by filling openings 803 with a conductive material to form interlayer conductor extensions (ICEs) 802.1, 804.1, . . . 814.1, 816.1, which electrically contact the respective interlayer conductors. The conductive material for insulation layer 801 and for the ICEs can be, for example, the same as for insulation layers 304, 306 and interlayer conductors 802, 804, . . . 814, 816.

Figure 8B:
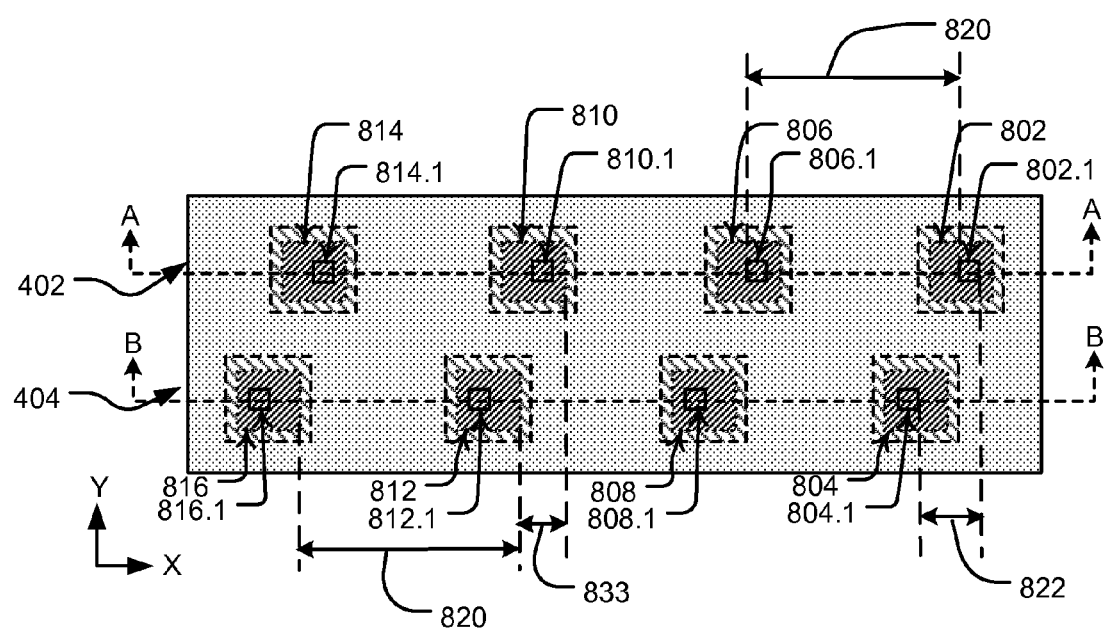
FIG. 8B is a simplified top view diagram based on the structure of FIG. 8A showing the size and spacing of the interlayer conductors and the interlayer conductor extensions.

As shown in FIG. 8B, which is a simplified top view based on the structure of FIG. 8A, the interlayer conductors 802, 804, . . . 814, 816 and their corresponding ICEs 802.1, 804.1, . . . 814.1, 816.1 are arranged in the first row 402 and in the second row 404. The interlayer conductors and ICEs in the same row are generally aligned in the X-direction with the interlayer conductors 802, 804, . . . 814, 816 in contact with the contact areas 704 on the corresponding semiconductor pads 310, 312, . . . , 322, 324. Additionally, the interlayer conductors 802, 804, . . . 814, 816 in a row and conductor extensions 802.1, 804.1, . . . 814.1, 816.1 in a row (for example, 802.1, 806.1 in row 402) can have a first pitch 820 in the X-direction. The interlayer conductor extensions 802.1, 804.1, . . . 814.1, 816.1 in adjacent rows (for example, 802.1, 804.1) are laterally offset from one another when viewed in the Y direction by an offset distance 822 by virtue of the lateral offset of narrow openings 803 as shown in FIGS. 8A and 8B. The offset distance 822 is greater than the width W3 of the ICEs 802.1, 804.1, . . . 814.1, 816.1, see FIG. 9B, so that ICEs in adjacent rows are completely laterally offset from one another. Offset dimension 822 can be less than the first pitch 820. In some examples, offset distance 822 will be equal to one half of first pitch 820 so that interconnect conductors 922-936, see FIG. 9, will have a regular lateral spacing. In certain implementations, offset distances 822 and 833 can each be less than about half of the first pitch 820. As discussed, forming the via openings 702 for interlayer conductors is a limiting lithography step for high density conductive lines (for example, ML3 in FIG. 1). By having a greater pitch and a more relaxed critical dimension for forming the interlayer conductors, the interlayer conductors can accommodate a larger number of semiconductor layers in the 3D stack.

Figure 9:
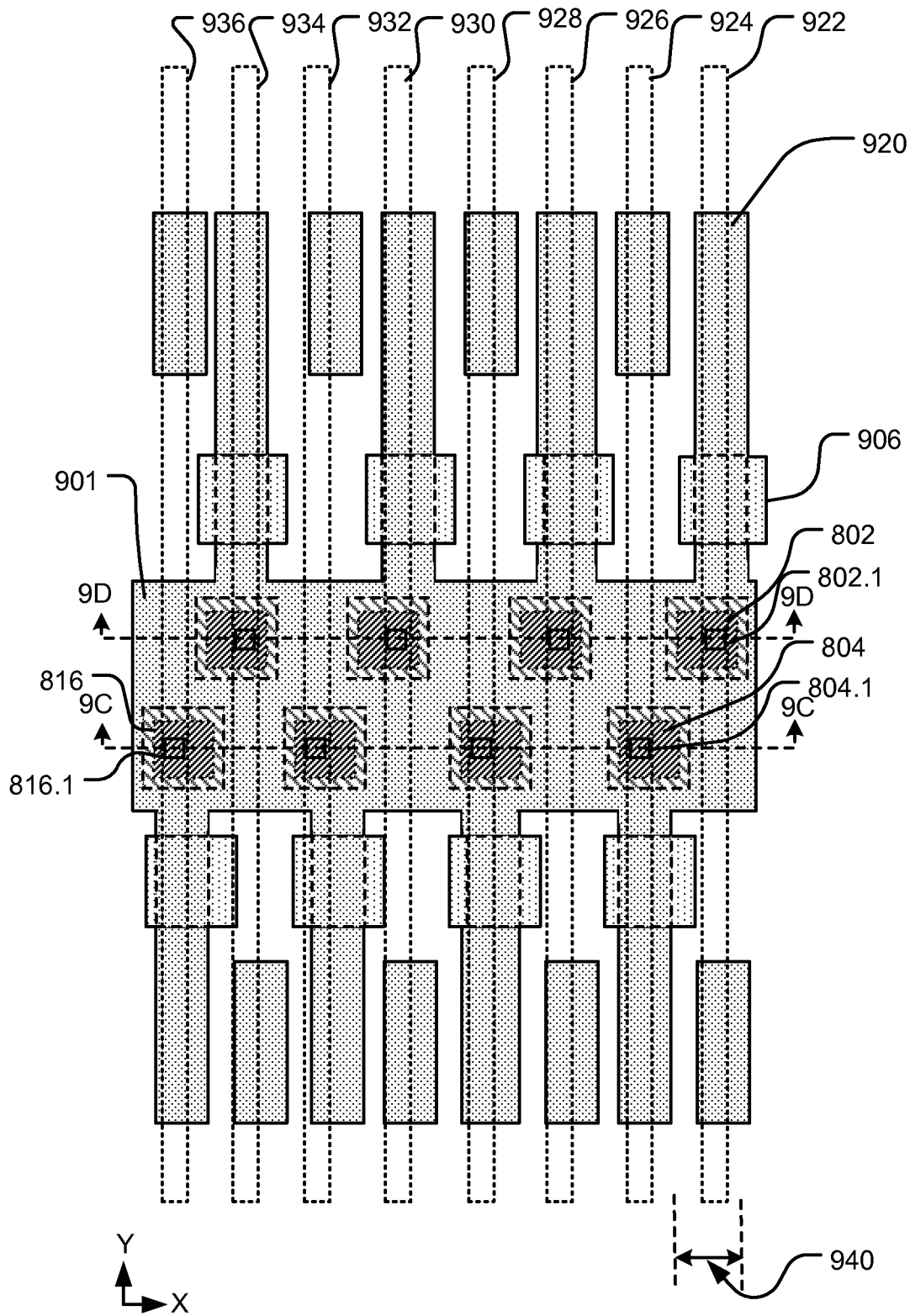
Figure 9A:
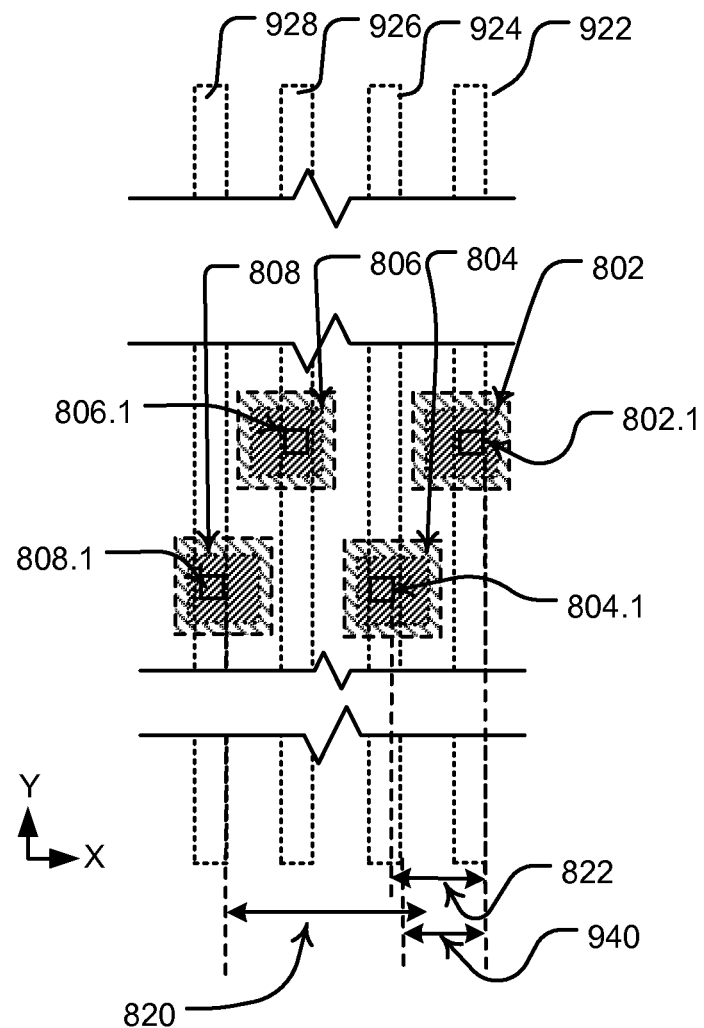
FIG. 9A illustrates relative dimensions and locations of various elements of the interconnect conductors, interlayer conductor extensions, and interlayer conductors for the 3D semiconductor device of FIG. 9.

FIG. 9 illustrates a layout view of the stack 901 of semiconductor pads 310, 312, . . . 322, 324 as in FIG. 8B after forming a plurality of interconnect conductors 922, 924, . . . 934, 936 over and in contact with the respective interlayer conductors 802, 804, . . . 814, 816 through the ICEs 802.1, 804.1, . . . 814.1, 816.1. Cross-sectional views are shown in FIGS. 9C and 9D. Because of the inherent taper in the creation of contact openings 702, and thus of the resulting interlayer conductors 802, 804, . . . 814, 816, dimensions of the interlayer conductors at the top can be greater than at the bottoms adjacent to landing areas 410-424. See FIG. 16B. The dimension of the contact openings 702 at the top of the openings, as opposed to at the bottoms of the openings, can be a critical limiting dimension when determining how closely components can be spaced adjacent to one another. The plurality of interconnect conductors are provided in dashed lines to better visualize their relation with other elements of the device. Interconnect conductors 922, 924, . . . 934, 936 are extended over the active strips, such as active strips 102-105 of FIG. 1, to connect each of the semiconductor pads 310, 312, . . . 322, 324 to a respective operation circuitry. Such operation circuitry can include for example, a read circuitry or a decoding circuitry. In this example, active strip 920 is connected to semiconductor pad 324 and passes through source select gate 906 to a source line terminal at a distal end of the active strip 920. Interconnect conductor 922 is in physical and electrical contact with interlayer conductor 802 through interlayer conductor extension 802.1 and need not be perfectly aligned with interlayer conductor 802. Interconnect conductor 922 is also over a portion of interlayer conductor 804 but is electrically isolated from interlayer conductor 804 by insulation layer 801. The interconnect conductors 922-936 can have a second pitch 940 in the X-direction. Second pitch 940 is less than the first pitch 820 (see FIG. 9A) of the interlayer conductor extensions in the X-direction, allowing for a dense arrangement of interconnect conductors with a relatively relaxed critical dimension for the interlayer conductors. Depending on the lateral offset distance 822, see FIG. 9A, the first pitch 820 of the interlayer conductor extensions can be two times, three times or more of the second pitch 940 of the interconnect conductors. A simplified diagram showing interlayer conductors 802, 804, 806, 808 and ICEs 802.1, 804.1, 806.1, 808.1 relative to the corresponding overlying interconnect conductors 922, 924, 926, 928 is illustrated in FIG. 9A.

Figure 9B:
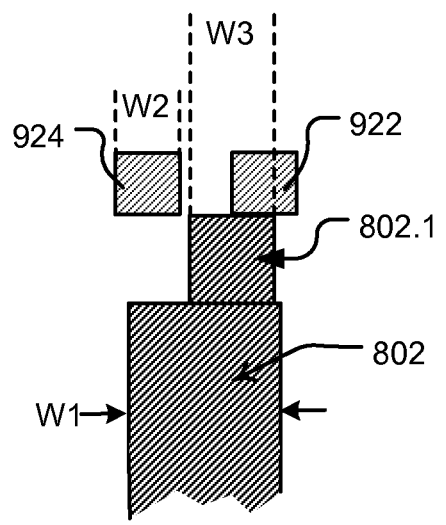
FIG. 9B illustrates relative dimensions and locations of various elements of the interconnect conductors, interlayer conductor extensions, and interlayer conductors for the 3D semiconductor device of FIG. 9.
Figure 9C:
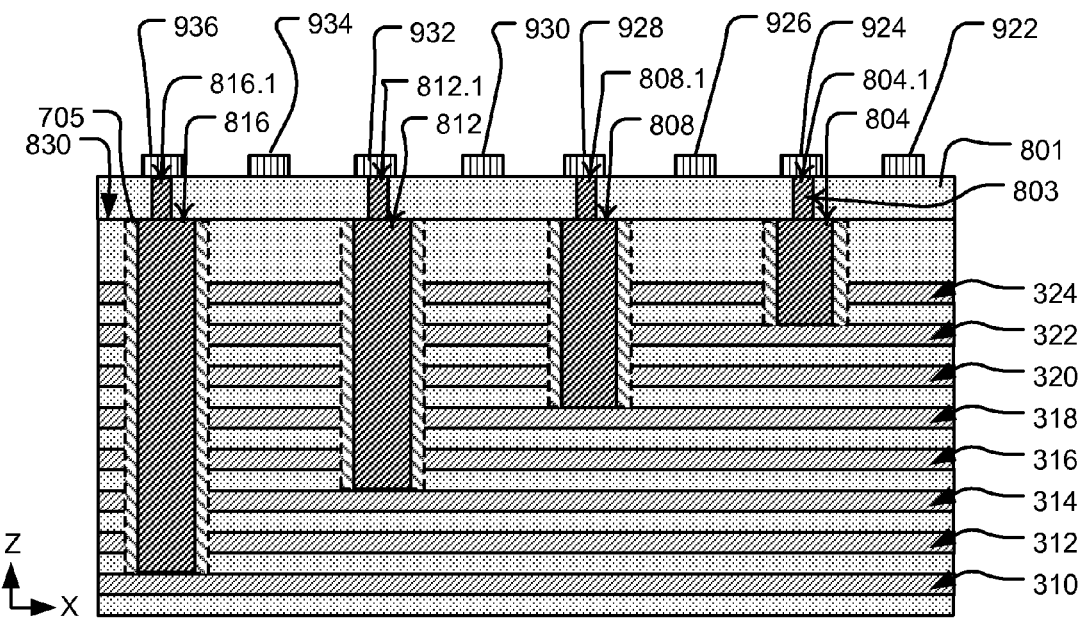
FIG. 9C is a cross-sectional view taken along line 9C-9C of FIG. 9.
Figure 9D:
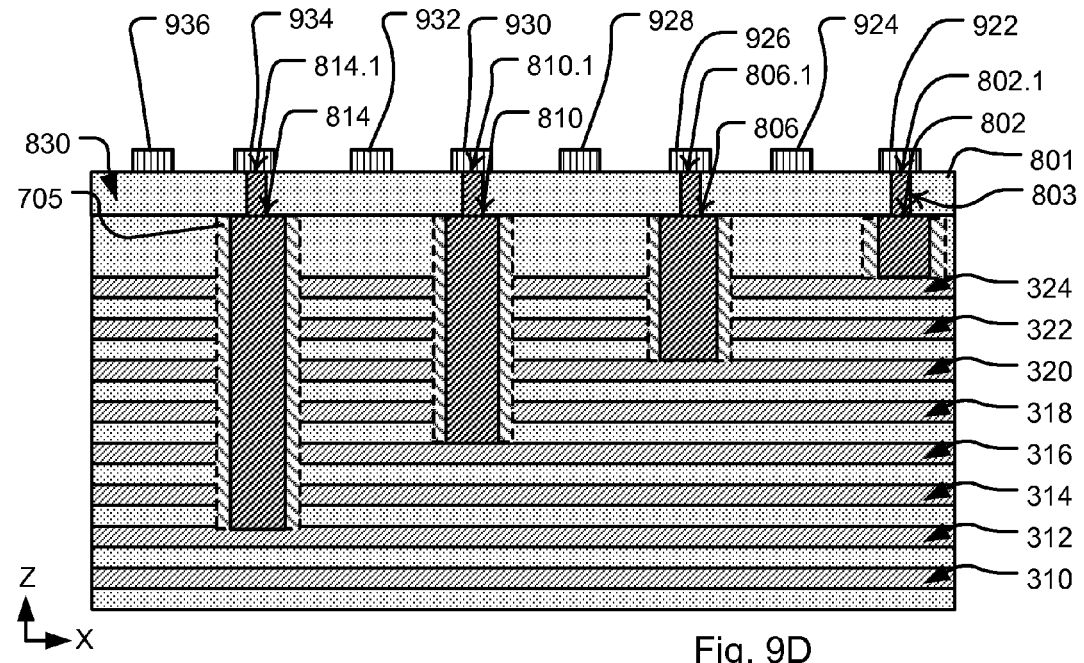
FIG. 9D is a cross-sectional view taken along line 9D-9D of FIG. 9.
Figure 10A:
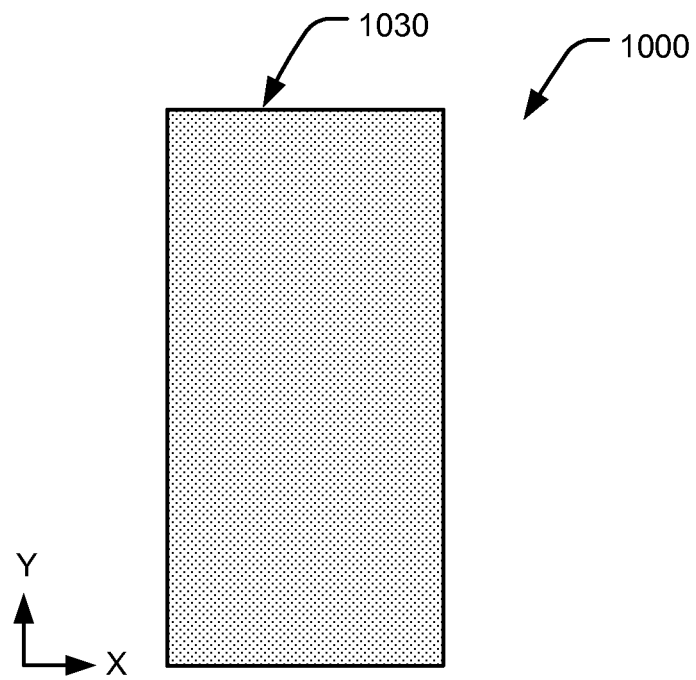
FIG. 10A is a top view diagram of a stack of semiconductor pads for a method of forming conductors for a 3D semiconductor device.
Figure 10:
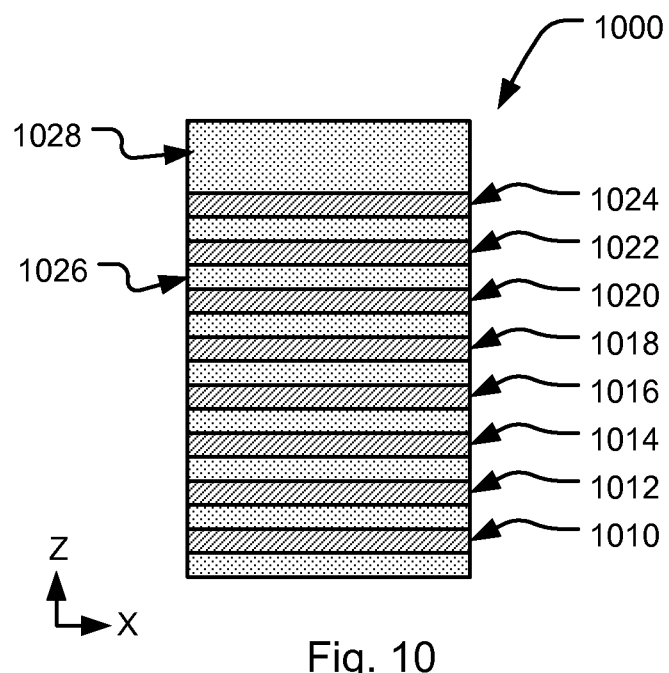

FIG. 9B illustrates relative dimensions of the upper end of an interlayer conductor (for example, 802), an interlayer conductor extension (for example, 822.1), and interconnect conductors (for example, 922, 924). Each of the upper ends of the interlayer conductors (for example, FIG. 802) has a width W1 in the longitudinal direction (X-direction). Width W1 is greater than width W3 of the interlayer conductor extension 802.1, and width W3 is greater than width W2 of the interconnect conductors 922, 924.

FIGS. 10-16 illustrate another method, similar to that described above with reference to FIGS. 3-9B, of forming interconnect conductors for a high density 3D semiconductor device. The method illustrated in FIGS. 10-16 can be applied to a stack having a large number of active layers and dense interconnect conductors (for example, ML3 in FIG. 1) necessitates a narrow pitch. As shown, a stack 1000 of semiconductor pads is provided. Eight semiconductor pads 1010, 1012, 1014, 1016, 1018, 1020, 1022, 1024 in the stack 1000, separated by insulator layers 1026, are illustrated though many more semiconductor pads can be included. The stack includes an insulator layer 1028 which overlies semiconductor pads 1010-1024. Each of the semiconductor pads 1010-1024 has an outer perimeter and includes a side 1030 coupled to a corresponding active layer in a semiconductor array (for example, a memory array).

Figure 11:
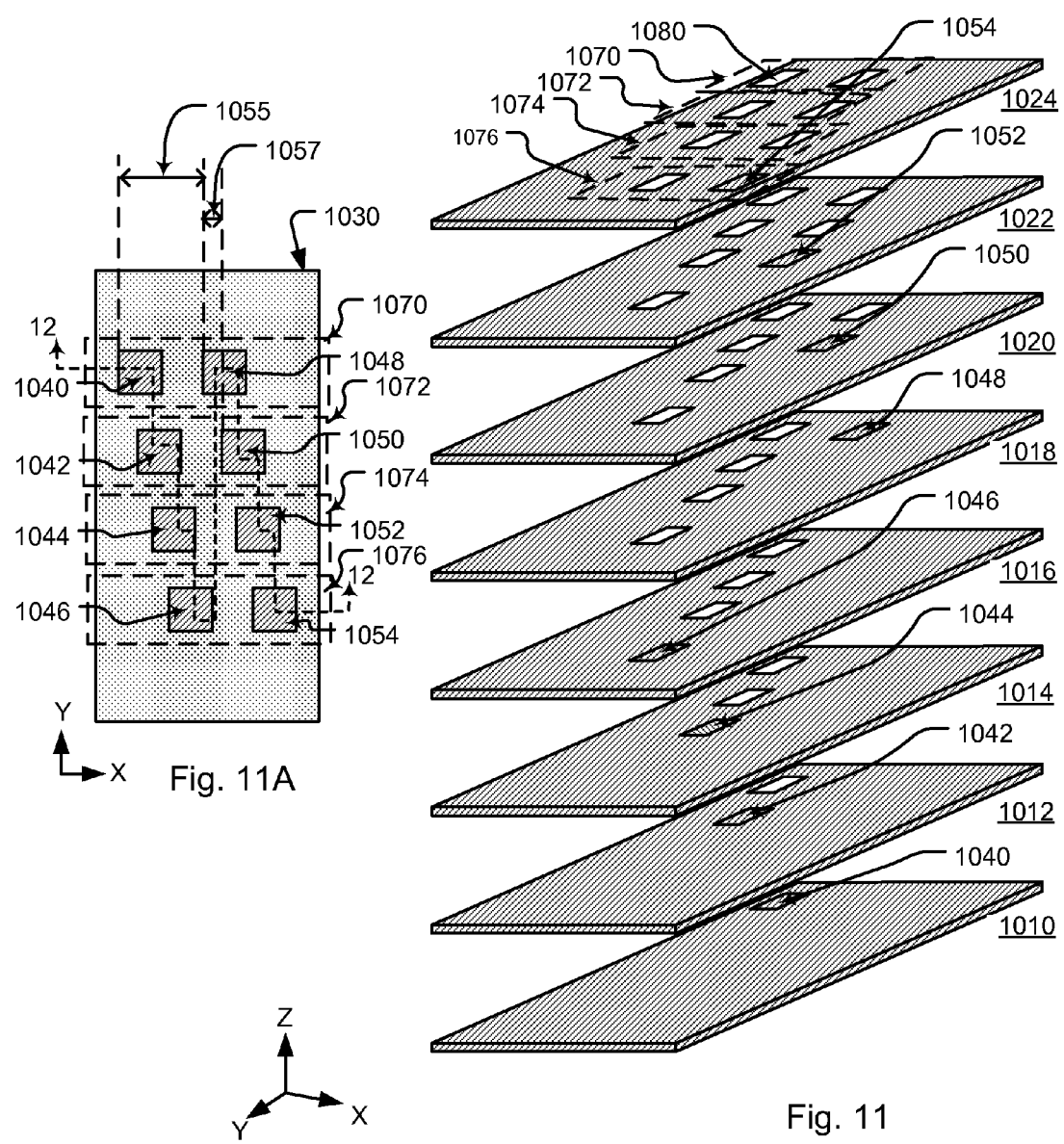

The next stage of the method includes forming openings 1080 in the semiconductor pads 1010-1024 to expose landing areas on each of the pads. FIG. 11 illustrates an expanded view of the stack of semiconductors pads 1010-1024 after forming openings 1080 in each of the pads except the lowest pad 1010. The openings 1080 expose a landing area on each of the semiconductor pads: landing area 1054 on semiconductor pad 1024, landing area 1052 on semiconductor pad 1022, landing area 1050 on semiconductor pad 1020, landing area 1048 on semiconductor pad 1018, landing area 1046 on semiconductor pad 1016, landing area 1044 on semiconductor pad 1014, landing area 1042 on semiconductor pad 1012, and landing area 1040 on semiconductor pad 1010. Openings are formed in each of the pads such that the landing areas are formed in one of the rows 1070, 1072, 1074, 1076 in each of the pads from a top view in this example. The rows are laterally offset in the Y direction and aligned parallel to the X direction. The landing areas are non-intersecting in the Z direction and configured in a "twisted" stair step manner as shown in the expanded view in FIG. 11. Examples of methods to form the openings are detailed in U.S. Pat. No. 8,383,512 referred to above and incorporated by reference.

FIG. 11A illustrates a top view of the stack of semiconductor pads 1010-1024 of FIG. 11. As shown, the landing areas 1040-1054 are arranged in rows 1070, 1072, 1074, 1076 from the top view. As described, each row is aligned parallel to edge 1030 in the X direction. In this example, multiple landing areas in different rows (four in this case, for example, landing areas 1048, 1050, 1052, 1054) are at least partially offset in the Y direction. The landing areas 1048, 1050 in adjacent rows 1070, 1072 are offset by an amount 1057, as shown. Landing areas on each row can have a pitch 1055 in the X direction. For this example of eight semiconductor pads 1010-1024 in the stack, four rows with two landing areas in each row are illustrated. The number of rows and the landing areas on each row can be many more depending on the number of bit lines for the device and the density of bit lines implemented. A corresponding cross section view of the stack of semiconductor pads in the XZ plane after formation of openings, taken generally along line 12-12 of FIG. 11A, is illustrated in FIG. 12.

Figure 12:
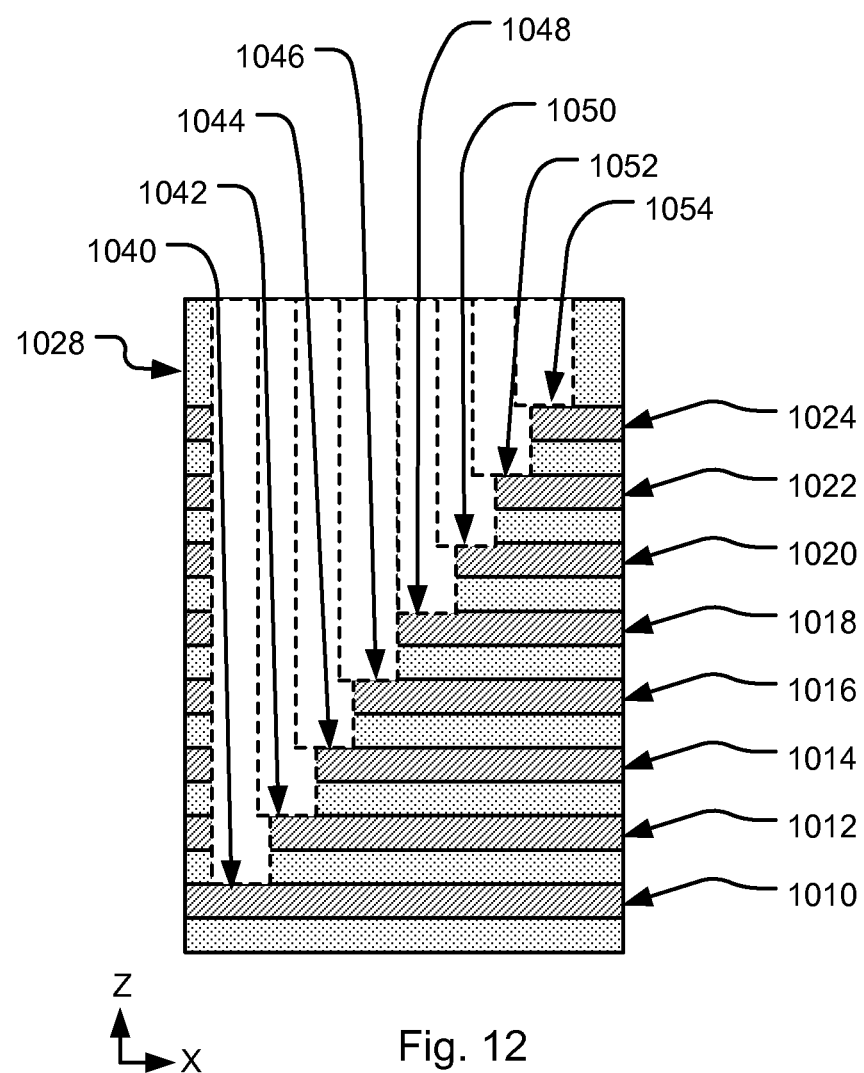
Figure 13A:
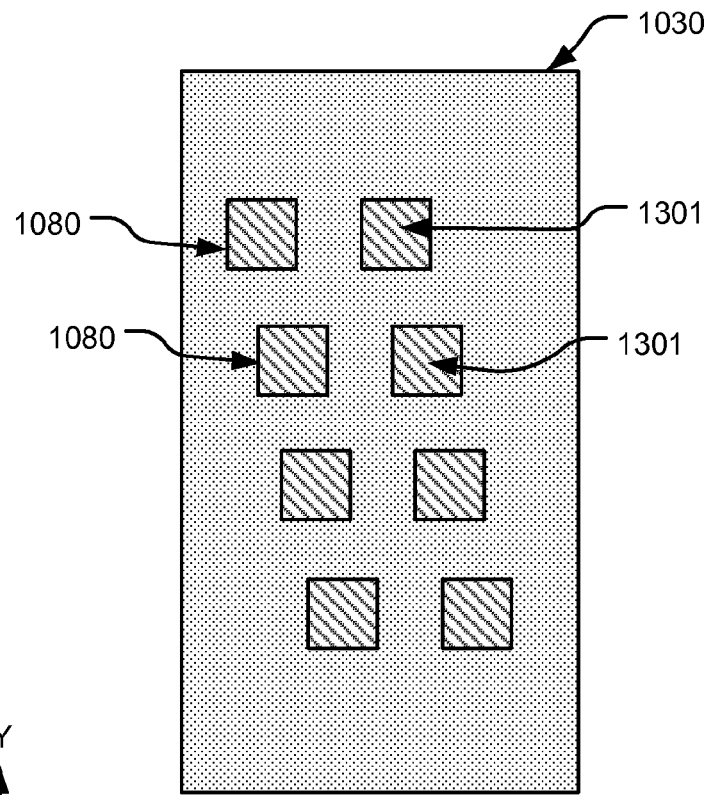
FIG. 13A is a top view diagram illustrating a structure in a stage of forming interlayer conductors for a 3D semiconductor device following FIG. 12.
Figure 13:
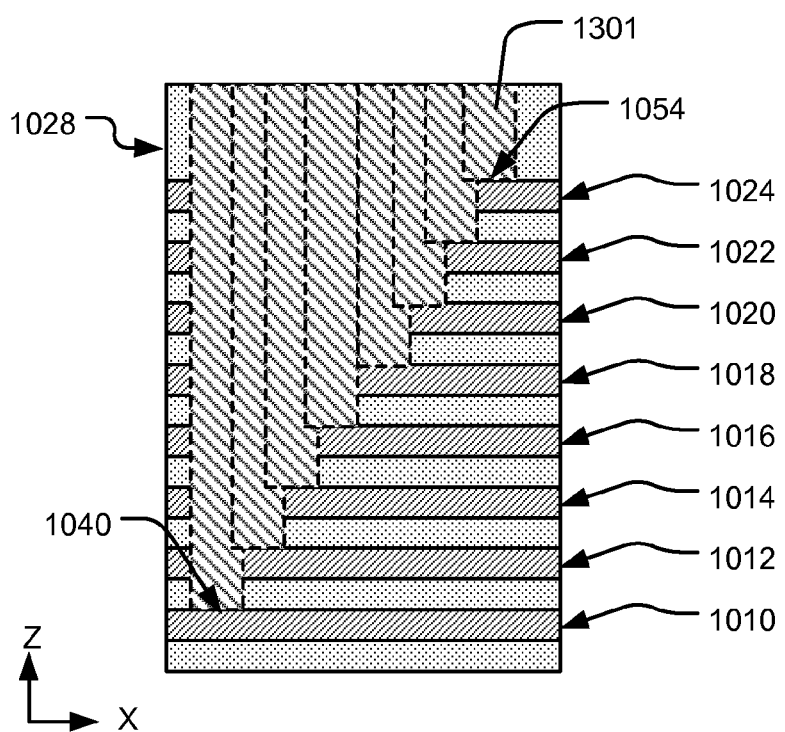

FIG. 13 illustrates the structure in FIG. 12 after deposition of an insulating fill material 1301 to fill each of the openings 1080. A corresponding top view diagram is illustrated in FIG. 13A. The insulator fill material 1301 can have a surface topography that can be planarized using a chemical mechanical polishing process or by an etch back process.

Figure 14A:
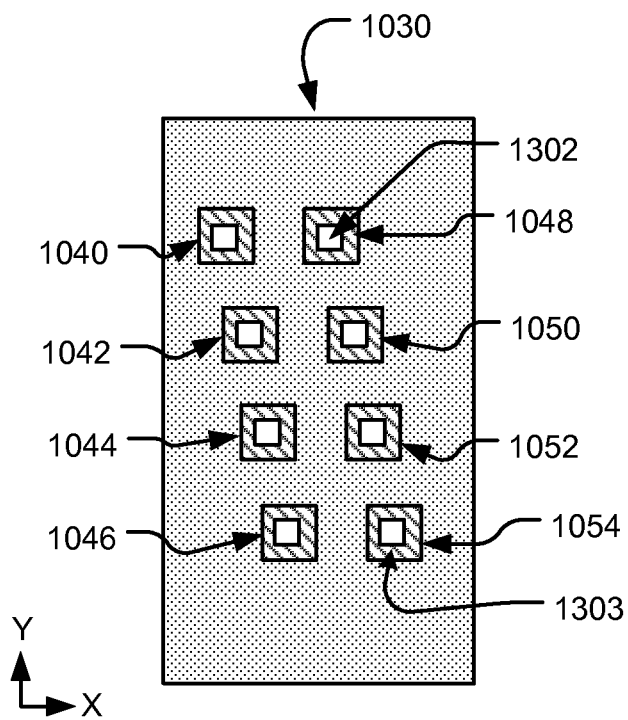
FIG. 14A is a top view diagram illustrating a structure in a stage of forming interlayer conductors for a 3D semiconductor device following FIGS. 13 and 13A.
Figure 14:
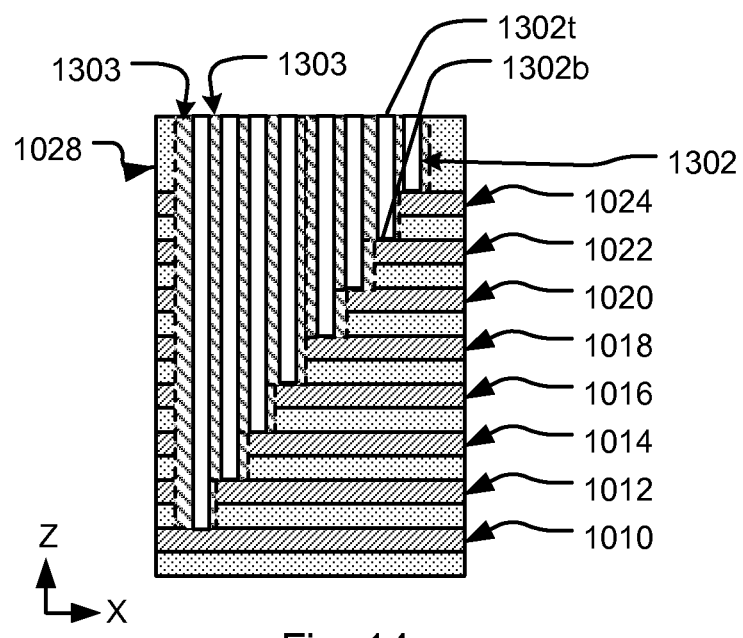

FIG. 14 illustrates a next stage of the method, which includes forming via openings 1302, sometimes called contact openings 1302, in the insulating fill material 1301 to expose a contact area for interlayer conductors on each of the semiconductor pads. As shown, each of the via openings 1302 may have an area (e.g. 1302t) at the top surface of insulation layer 1028 that is larger than an area (e.g. 1302b) at the corresponding landing area 1040-1054. A layer 1303 of insulation fill material 1301 surrounds each of the opening 1302. A corresponding top view diagram is illustrated in FIG. 14A. Via openings 1302, because of manufacturing constraints, will typically be larger in the area (e.g. 1302t) adjacent to the top surface of insulation layer 1028 than in the area (e.g. 1302b) at the bottom adjacent to landing areas 1040-1054 and will exhibit a taper. One result of the tapered via openings 1302 is illustrated in an exaggerated form in FIG. 16B. However, via openings 1302 are shown in most figures without a taper to simplify the figures. Because of the taper, dimensions of openings 1302 at the top can be greater than the dimensions of openings 1302 at the bottom adjacent to landing areas 1040-1054. The dimension of openings 1302 at the top of the openings, as opposed to at the bottoms of the openings, can be a critical limiting dimension when determining how closely components can be spaced adjacent to one another.

Figure 15:
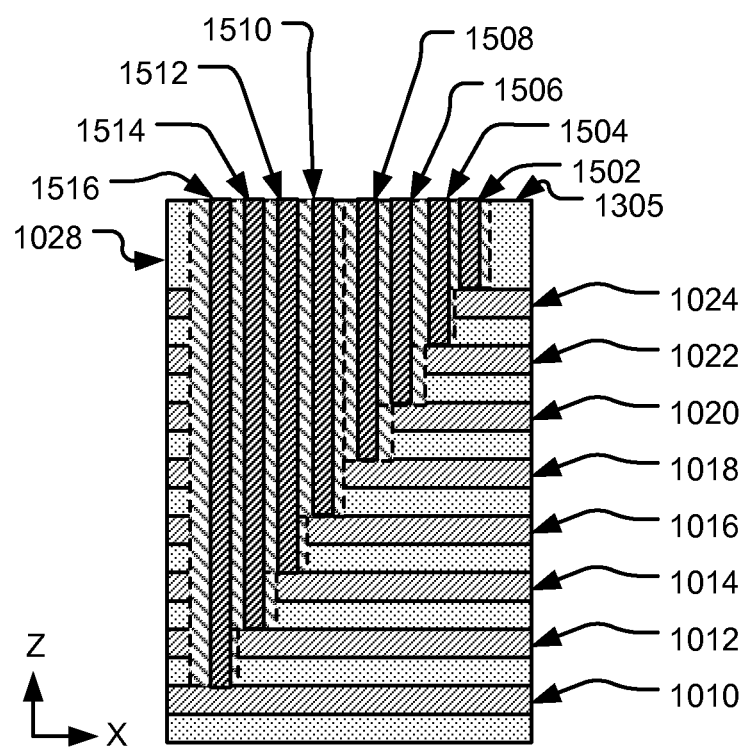

FIG. 15 illustrates a structure like that in FIG. 14 after deposition of a conductive material to fill each of the via openings 1302 to form a respective interlayer conductor 1502, 1504, ... 1514, 1516 in electrical and physical contact with the respective semiconductor pads 1024, 1022, ... 1012, 1010. Depending on the application, the conductive material can be a metal material or a doped (n+ or p+) polysilicon material. The conductive material can be removed from the insulator fill and overlying insulating material surface to physically isolate the interlayer conductors, such as by creating a planarized surface 1305.

Figure 15B:
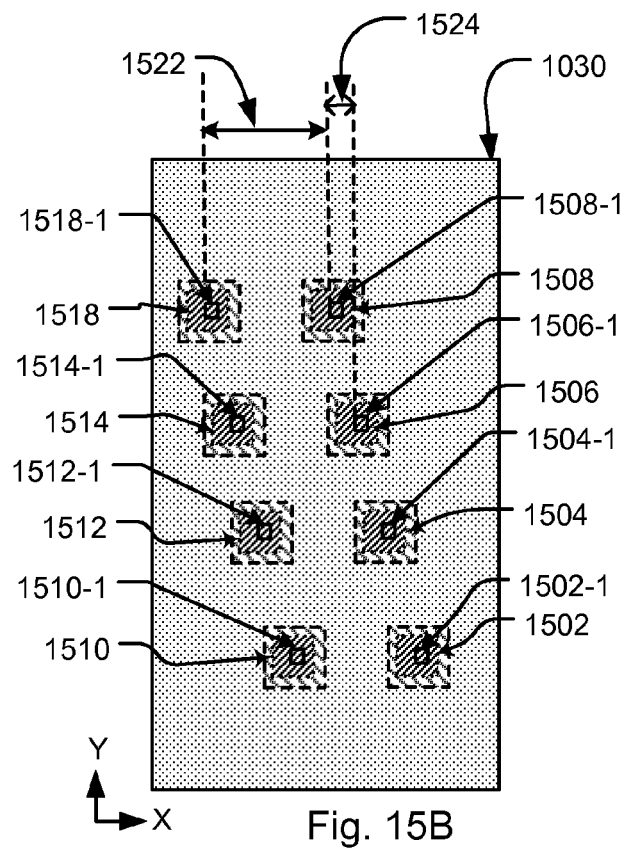
FIG. 15B is a simplified top view diagram based on the structure of FIG. 15A showing the size and spacing of the interlayer conductors and the interlayer conductor extensions.
Figure 15A:
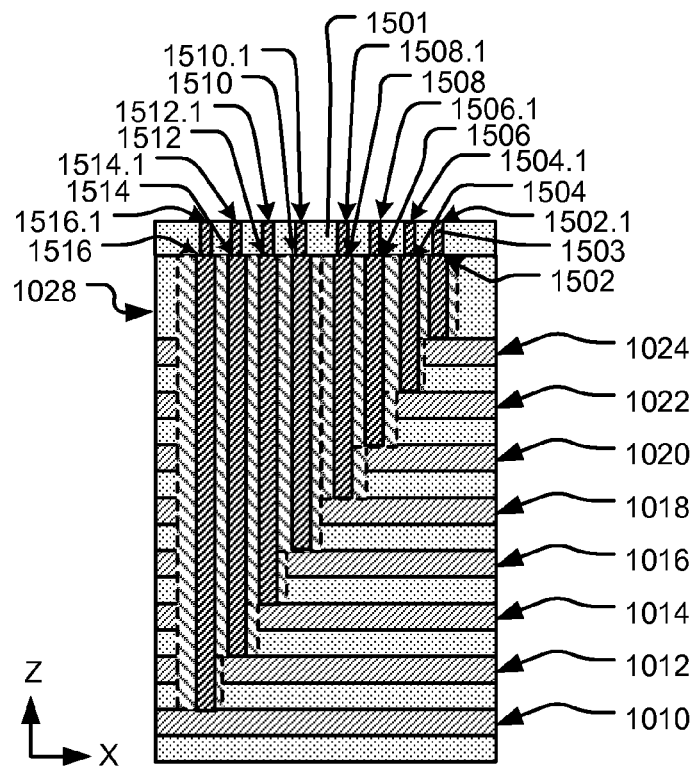
FIG. 15A shows the structure of FIG. 15 after forming an insulation layer over the upper ends of the interlayer conductors, forming relatively narrow openings through the insulation layer extending to the interlayer conductors, and filling the relatively narrow openings with a conductive material creating interlayer conductor extensions.

FIG. 15A show structure similar to that of FIG. 15 after depositing an insulator layer 1501 on surface 1305 followed by forming relatively narrow openings 1503 through insulator layer 1501 to open onto the upper surface of interlayer conductors 1502, 1504, ... 1514, 1516. This is followed by filling openings 1503 with a conductive material to form ICEs 1502.1, 1504.1, ... 1514.1, 1516.1, to electrically contact the respective interlayer conductors.

As shown in FIG. 15B, the interlayer conductor extensions (for example, 1508.1, 1518.1) on each row has a first pitch 1522 in the X-direction. Interlayer conductor extensions in adjacent rows (for example, 1508.1, 1506.1) are offset by an offset distance 1524 in the X-direction from the top view. The offset distance 1524 is less than the first pitch 1522 and, in this example, about ¼ of the first pitch 1522.

Figure 16:
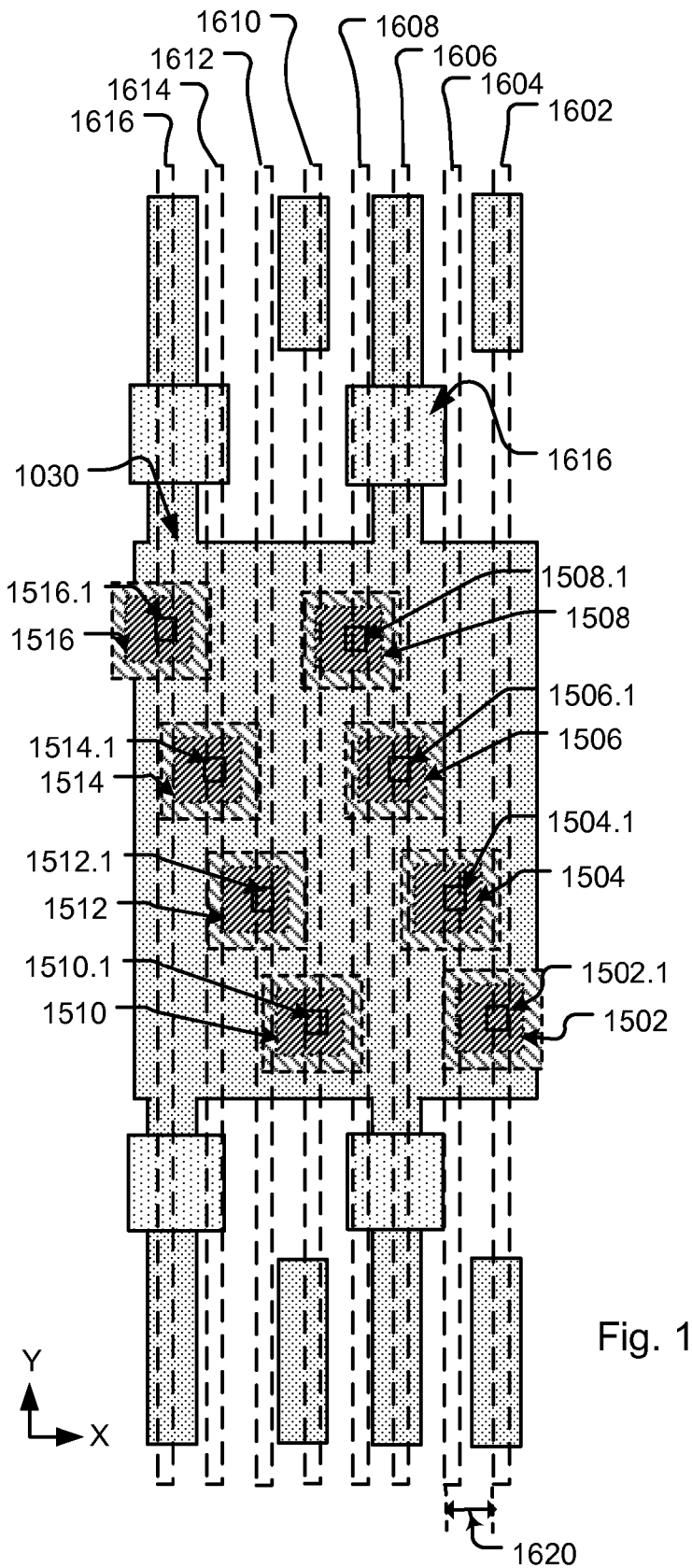

FIG. 16 illustrates a layout view of the semiconductor pads 1010, 1012, ... 1022, 1024 after forming interconnect conductors 1602, 1604, ... 1614, 1616 (such as global bit lines) over the stack of semiconductor pads in contact with the corresponding ICEs 1502.1, 1504.1, ... 1514.1, 1516.1/ interlayer conductors 1502, 1504, ... 1514, 1516. The interconnect conductors are drawn in dashed lines for a clearer view relative to various other elements. The interlayer conductors extensions 1502.1, 1504.1, ... 1514.1, 1516.1 have a second pitch 1620 in the X-direction. Because the interlayer conductor extensions in adjacent rows are offset by the offset distance 1524, the second pitch 1620 of the interconnect conductors can be less than the first pitch 1522 of the interlayer conductors in the X direction in the same row and, in this example, about ¼ of the first pitch 1522. The dimension of the contact openings 1302 at the top of the openings, as opposed to at the bottoms of the openings, can be a critical limiting dimension when determining how closely components can be spaced adjacent to one another. FIG. 16A is a simplified diagram illustrating the first pitch 1522 of the interlayer conductor extensions 1502.1, 1504.1, ... 1514.1, 1516.1 relative to the second pitch 1620 of the interconnect conductors 1602-1616 in the X-direction. The first pitch 1522 of the interlayer conductor extensions in the same row is greater than about four times the pitch 1620 of the interconnect conductors in the X-direction in this example. Also shown in FIG. 16A, the interlayer conductor extensions in adjacent rows are offset by an offset distance 1524, which is less than the first pitch 1522. As discussed with regard to FIGS. 9, 9A, and 9B, this facilitates the limiting lithography process for forming the interlayer via openings for the overlying high density interconnect conductors in various embodiments.

FIG. 16B illustrates relative dimensions of the interconnect conductor (for example, 1602, 1604), the interlayer conductor extension (for example, 1502.1) and the interlayer conductor (for example, 1502). The upper ends of interlayer conductors 1502, 1504, ... 1514, 1516 can have a larger width W1 relative to the width W3 of the interlayer conductor extensions 1502.1, 1504.1, ... 1514.1, 1516.1 measured at surface 1305. Width W1 of the upper ends of interlayer conductors 1502, 1504, ... 1514, 1516 can be greater than the width W2 of the overlying interconnect conductors 1602-1616. The width at the top of interlayer conductor 1502, at surface 1305, is greater than the width at its bottom, adjacent to contact area 704. Width W1 is also greater than length Y1 of interlayer conductors 1502, 1504, ... 1514, 1516.

For this example, width W1 is about four times greater than each of width W2, width W3, and length Y1. In general, the width W1 of each of the interlayer conductors (for example, 1502) upper ends of the can be greater than about x times the width W2 of the interconnect conductor 1602-1616, where x is the number of interlayer conductors overlying the offset landing areas 1048, 1050, 1052, 1054 as illustrated.

Figure 17:
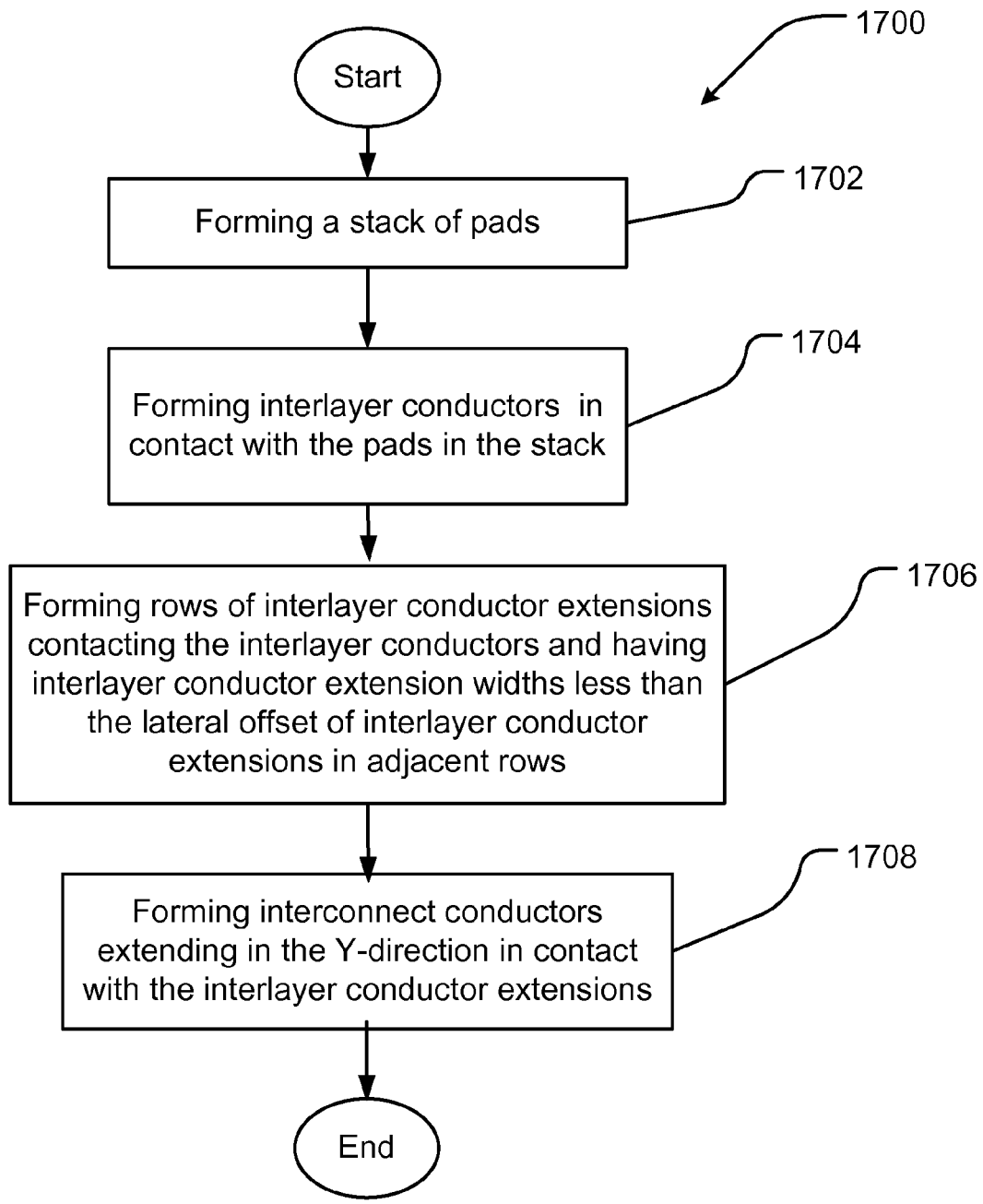
FIG. 17 illustrates a process flow for forming interlayer conductors and interconnect conductors for a 3D semiconductor device.

FIG. 17 illustrates an example of a process flow 1700 for a method of forming interlayer conductors for a 3D semiconductor device, for example, the device in FIG. 1. The method includes the following steps.

Step 1702: a stack of pads (for example, 310-324), coupled to respective active layers of a circuit, is formed with the active layers having a first side. The active layers can be associated with local bit lines of a memory device. In some examples forming the stack of pads includes patterning the active layers to form parallel strips of semiconductor material which terminate in the respective pads. In some examples, the parallel strips of semiconductor material are adapted to act as channels of memory cells; and, in other examples, they are adapted to act as wordlines of memory cells.

Step 1704: interlayer conductors (for example, 802-816) are formed with the interlayer conductors having lower ends in contact with corresponding pads in the stack and upper ends at a first surface (for example, 830).

Step 1706: interlayer conductor extensions (ICEs) (for example, 802.1-8164.1) are formed with lower extension ends contacting the upper ends of the interlayer conductors and upper extension ends of at a second surface. The ICEs being arranged in rows (for example, 402, 404) extending in an X direction, adjacent rows being separated from one another in a Y direction generally perpendicular to the X direction. The ICEs in a row have a first pitch (for example, 820) in the X direction. The ICEs have an ICE width (for example, W3) in the X direction. The ICEs in adjacent rows being offset in the X direction by a lateral offset distance (for example, 822), the lateral offset distance being greater than the ICE width. The ICEs can be configured to be closer relative to either a left side or a right side of the upper ends of the interlayer conductors in a first row and closer relative to the other side of the upper ends of the interlayer conductors in a second, adjacent row (for example, FIG. 8B).

Step 1708: interconnect conductors (for example, 922-936) are formed over and in contact with the ICEs. The interconnect conductors extend in the Y direction and have a second pitch (for example, 940) in the X direction less than the first pitch. The interconnect conductors can extend perpendicular to the first side over the stack of semiconductor pads.

The above sequence of steps provides a method for forming narrow pitch interconnect conductors for a high density 3D device according to various embodiments. The method provides a way of forming contact openings for interlayer conductors using a more relaxed critical dimension for a high density overlying interconnect conductor structure.

Figure 18:
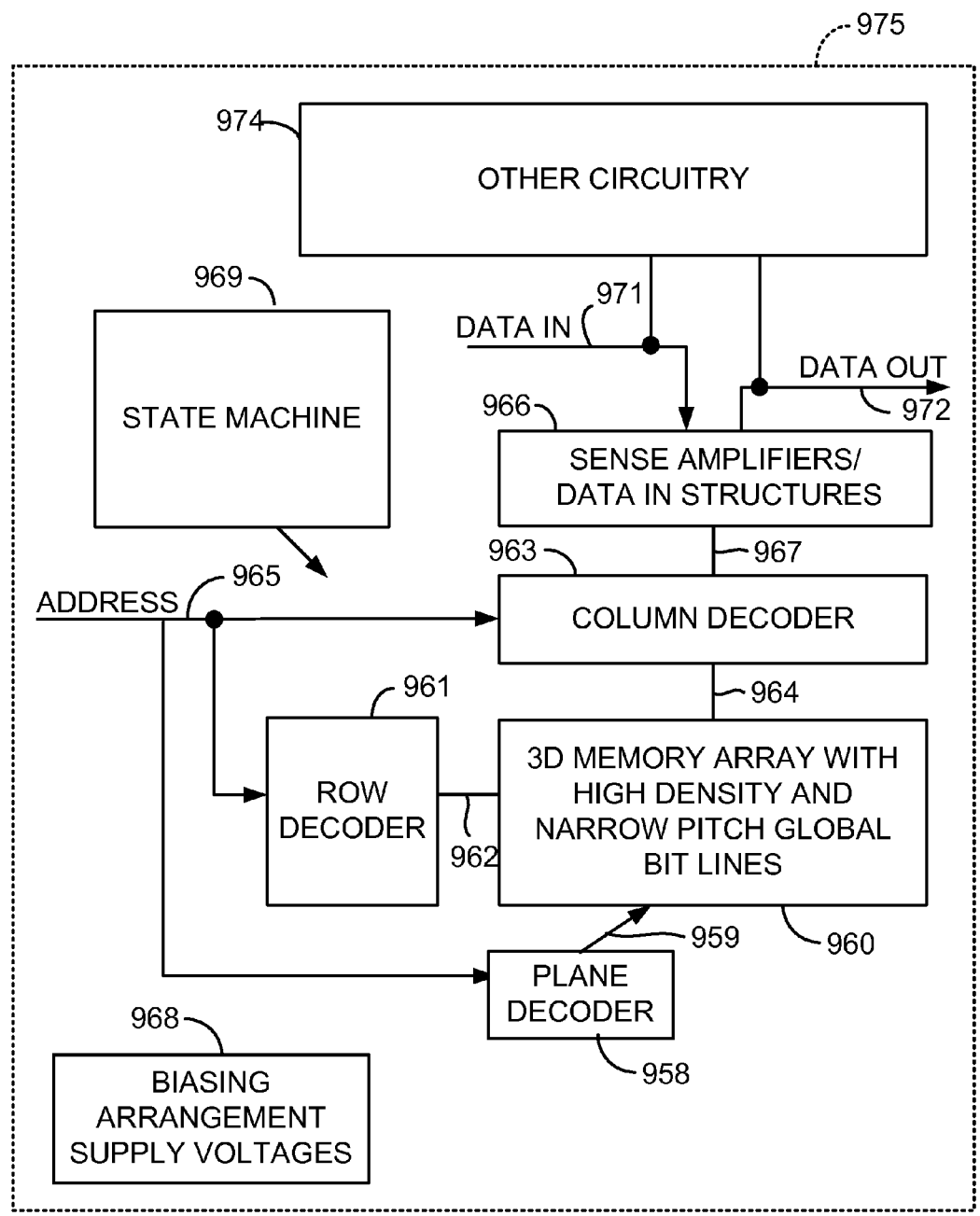
FIG. 18 is a simplified block diagram of an integrated circuit according to an embodiment of the present invention.

FIG. 18 is a simplified block diagram of an integrated circuit according to an embodiment of the present invention. The integrated circuit line 975 includes a 3D NAND flash memory array 960, having a structure like that of FIG. 1, for example, on a semiconductor substrate with high density and narrow pitch global bit lines. A row decoder 961 is coupled to a plurality of word lines 962, and arranged along rows in the memory array 960. A column decoder 963 is coupled to a plurality of SSL lines 964 arranged along columns corresponding to stacks in the memory array 960 for reading and programming data from the memory cells in the array 960. A plane decoder 958 is coupled to a plurality of planes in the memory array 960 via bit lines 959. Addresses are supplied on bus 965 to column decoder 963, row decoder 961 and plane decoder 958. Sense amplifiers and data-in structures in block 966 are coupled to the column decoder 963, in this example, via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented, in this example, using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

In various embodiments, a 3D array of devices, for example, memory devices, is provided. The 3D array of devices includes a plurality of patterned layers of semiconductor material. Each pattern layer includes parallel strips of semiconductor material with one of their ends connected to a first side of a semiconductor pad. The semiconductor pads connected to the plurality of patterned layers are disposed in a stack. Each of the semiconductor pads includes a landing area for an interlayer conductor connected to an overlying interconnect conductor aligned along the parallel strips of semiconductor material. The interlayer conductors are arranged in rows in a top view and disposed in a via structure surrounded by an insulating material. Each of the rows is aligned along an X direction, parallel to the first side. The interlayer conductors in each row have a first pitch in the X-direction. In various embodiments, the interlayer conductors are at least partially offset in a Y direction, perpendicular to the X direction. Due to the offset, the interconnect conductors extending in the Y-direction have a second pitch in the X-direction less than the first pitch. In various embodiments, the landing areas can be formed in a twisted stair step manner as illustrated in FIG. 5 and FIG. 12 to increase the density of the interconnect conductors (for example, bit lines or word lines) and to increase the data rate of the device.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A method of forming an interconnect conductor structure, comprising:
    forming a stack of pads coupled to respective active layers of a circuit, the stack of pads having a first side;
    forming interlayer conductors arranged in rows extending in an X direction in contact with landing areas on corresponding pads in the stack, adjacent rows being separated from one another in a Y direction generally perpendicular to the X direction, the interlayer conductors in a row having a first pitch in the X direction, and the interlayer conductors in adjacent rows being offset in the X direction by an amount less than the first pitch; and
    forming interconnect conductors over and in contact with interlayer conductors, the interconnect conductors extending in the Y direction and having a second pitch less than the first pitch.

2. The method of claim 1, including forming N rows of openings for the interlayer conductors in the stack of pads, where N is an integer greater than 2.

3. The method of claim 1, wherein the X direction is parallel to the first side.

4. The method of claim 1, wherein the interlayer conductors forming step further comprises:
    forming rows of via openings in the stack of pads to expose landing areas on the active layers so that the landing areas in a row are partially offset in the Y direction relative to landing areas in an adjacent row;
    filling the via openings with an insulation material;
    forming contact openings in the insulation material in the via openings to expose contact areas on the landing areas; and
    forming the interlayer conductors in the contact openings.

5. The method of claim 4, wherein the interlayer conductors forming step comprises forming interlayer conductors including lower portions and upper, interlayer conductor extensions (ICEs) extending from upper ends of the lower portions, the ICE forming step forms the ICEs closer to either a left side or a right side of the upper ends of the interlayer conductors in a first row and closer relative to the other side of the upper ends of the interlayer conductors in a second, adjacent row.

6. The method of claim 1, wherein the interconnect conductors extend perpendicular to the first side over the stack of pads.

7. The method of claim 1, wherein said forming the stack of pads includes patterning the active layers to form parallel strips of semiconductor material which terminate in the respective pads, adapted to act as channels of memory cells.

8. The method of claim 1, wherein said forming the stack of pads includes patterning the active layers to form parallel strips of conductive material which terminate in the respective pads, adapted to act as wordlines of memory cells.

9. The method of claim 1, wherein:
    the interlayer conductors forming step comprises forming interlayer conductors including lower portions and upper, interlayer conductor extensions (ICEs) extending from upper ends of the lower portions, the ICEs having an ICE width in the X direction, the upper ends of the lower portions having an upper end width in the X direction, the ICE width being less than the upper end width, the ICEs in adjacent rows being offset in the X direction by a lateral offset distance, the lateral offset distance being greater than the ICE width; and
    the interconnect conductors are formed over and in contact with the ICEs.

10. A device, comprising:
    a stack of pads coupled to respective active layers of a circuit, the stack of pads having a first side;
    interlayer conductors arranged in rows extending in an X direction in contact with landing areas on corresponding pads in the stack;
    adjacent rows being separated from one another in a Y direction generally perpendicular to the X direction;
    the interlayer conductors in a row having a first pitch in the X direction;
    the interlayer conductors in adjacent rows being offset in the X direction by an amount less than the first pitch; and
    interconnect conductors over and in contact with interlayer conductors, the interconnect conductors extending in the Y direction and having a second pitch less than the first pitch.

11. The device of claim 10, wherein the interlayer conductors are surrounded by an insulating fill.

12. The device of claim 10, wherein the X direction is parallel to the first side.

13. The device of claim 10, wherein the interconnect conductors extend over the stack of pads and are perpendicular to the first side.

14. The device of claim 10, wherein the interconnect conductors comprise a doped semiconductor material.

15. The device of claim 10, wherein the interconnect conductors comprise a metal material.

16. The device of claim 10, wherein the active layers include parallel strips of semiconductor material which terminate in the respective pads, adapted to act as channels of memory cells.

17. The device of claim 10, wherein the interconnect conductors connect the respective active layers to a decoding circuitry or a read circuitry.

18. The device of claim 10, further comprising:
- the interlayer conductors comprising lower portions and upper, interlayer conductor extensions (ICEs) extending from upper ends of the lower portions;
- the ICEs having an ICE width in the X direction, the upper ends of the lower portions having an upper end width in the X direction, the ICE width being less than the upper end width;
- the ICEs in adjacent rows being offset in the X direction by a lateral offset distance, the lateral offset distance being greater than the ICE width; and
- the interconnect conductors being over and in contact with the ICEs.

\* \* \* \* \*